(12) United States Patent
Jiao et al.

(10) Patent No.: US 12,276,819 B2
(45) Date of Patent: Apr. 15, 2025

(54) DISPLAY PANEL, AND METHOD FOR MANUFACTURING THE SAME, AND DISPLAY APPARATUS

(71) Applicant: BOE TECHNOLOGY GROUP CO., LTD., Beijing (CN)

(72) Inventors: Zhiqiang Jiao, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 413 days.

(21) Appl. No.: 17/779,814

(22) PCT Filed: Apr. 9, 2021

(86) PCT No.: PCT/CN2021/086191
§ 371 (c)(1),
(2) Date: May 25, 2022

(87) PCT Pub. No.: WO2021/238444
PCT Pub. Date: Dec. 2, 2021

(65) Prior Publication Data
US 2023/0003927 A1  Jan. 5, 2023

(30) Foreign Application Priority Data
May 29, 2020 (CN) .......................... 202010478142.4

(51) Int. Cl.
*H10K 59/80* (2023.01)
*G02B 5/02* (2006.01)
(Continued)

(52) U.S. Cl.
CPC .......... *G02B 5/201* (2013.01); *G02B 5/0242* (2013.01); *G02B 5/206* (2013.01); *H10K 50/854* (2023.02);
(Continued)

(58) Field of Classification Search
CPC ...... G02B 5/201; G02B 5/206; G02B 5/0242; H10K 50/854; H10K 50/858; H10K 59/38; H10K 71/00; H10K 59/877; H10K 59/35
See application file for complete search history.

(56) References Cited

U.S. PATENT DOCUMENTS 9,935,157 B2 * 4/2018 Tang .................. H10K 50/84
2005/0212728 A1 9/2005 Miller et al.
(Continued)

FOREIGN PATENT DOCUMENTS

| CN | 102023380 A | 4/2011 |
| CN | 105097878 A | 11/2015 |

(Continued)

OTHER PUBLICATIONS

First Office Action issued by the Chinese Patent Office for Application No. 202010478142.4 on Aug. 23, 2021.
(Continued)

*Primary Examiner* — David Vu
*Assistant Examiner* — Brandon C Fox
(74) *Attorney, Agent, or Firm* — XSENSUS LLP

(57) ABSTRACT

A display panel includes at least one pixel unit. The pixel unit includes a first sub-pixel, a second sub-pixel, a third sub-pixel and a fourth sub-pixel. The first, second, third and fourth sub-pixels include a first color filter portion, second color filter portion, a third color filter portion and a fourth color filter portion, respectively. The first, second and third color filter portions are configured to emit light of three primary colors. A material of the fourth color filter portion includes at least one light conversion material configured to convert a portion of light directed to the fourth color filter portion into light of at least one primary color. The light of at least one primary color is capable of being mixed with (Continued)

another portion of the light directed to the fourth color filter portion to generate white light.

20 Claims, 10 Drawing Sheets

(51) Int. Cl.
    *G02B 5/20*         (2006.01)
    *H10K 50/854*     (2023.01)
    *H10K 50/858*     (2023.01)
    *H10K 59/35*      (2023.01)
    *H10K 59/38*      (2023.01)
    *H10K 71/00*      (2023.01)

(52) U.S. Cl.
    CPC ........... *H10K 50/858* (2023.02); *H10K 59/35* (2023.02); *H10K 59/38* (2023.02); *H10K 59/877* (2023.02); *H10K 71/00* (2023.02)

(56) References Cited

U.S. PATENT DOCUMENTS

| | | | |
|---|---|---|---|
| 2011/0069369 A1 | 3/2011 | Park et al. | |
| 2011/0073844 A1* | 3/2011 | Pieh ................... | H10K 50/125 257/40 |
| 2012/0319564 A1 | 12/2012 | Ghosh et al. | |
| 2016/0064694 A1* | 3/2016 | Choi .................. | H10K 59/8792 257/40 |
| 2017/0179438 A1* | 6/2017 | Xu ..................... | H10K 59/8791 |
| 2017/0186819 A1* | 6/2017 | Yun ................... | H10K 59/8731 |
| 2018/0182824 A1 | 6/2018 | Gu et al. | |
| 2018/0301513 A1 | 10/2018 | Li | |
| 2018/0321526 A1* | 11/2018 | Chang ................ | G02B 6/005 |
| 2019/0058013 A1* | 2/2019 | Lee .................... | H10K 59/38 |
| 2019/0371866 A1 | 12/2019 | Kim et al. | |
| 2020/0075682 A1 | 3/2020 | Jeong et al. | |
| 2020/0098836 A1 | 3/2020 | Song | |
| 2020/0106041 A1 | 4/2020 | Lee et al. | |
| 2020/0119101 A1* | 4/2020 | Lee .................... | H10K 59/878 |
| 2020/0161503 A1 | 5/2020 | Chen et al. | |
| 2020/0168669 A1 | 5/2020 | Chen et al. | |
| 2024/0045260 A1* | 2/2024 | Chen ................. | G02F 1/133614 |

FOREIGN PATENT DOCUMENTS

| | | |
|---|---|---|
| CN | 105140264 A | 12/2015 |
| CN | 106298854 A | 1/2017 |
| CN | 106910836 A | 6/2017 |
| CN | 109065601 A | 12/2018 |
| CN | 110085638 A | 8/2019 |
| CN | 110288904 A | 9/2019 |
| CN | 110544708 A | 12/2019 |
| CN | 110867466 A | 3/2020 |
| CN | 110875359 A | 3/2020 |
| CN | 110875360 A | 3/2020 |
| CN | 110970473 A | 4/2020 |
| CN | 111524463 A | 8/2020 |

OTHER PUBLICATIONS

Second Office Action issued by the Chinese Patent Office for Application No. 202010478142.4 on Jun. 8, 2022.

* cited by examiner

300

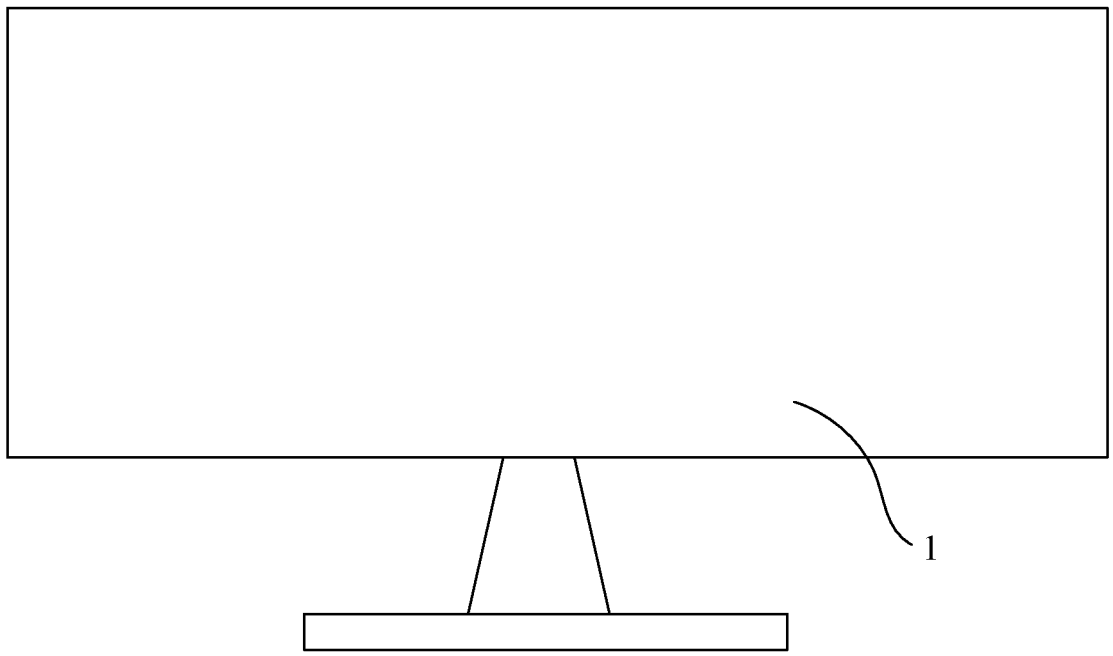

FIG. 8

| Form the at least one pixel unit on a substrate, the pixel unit including the first sub-pixel, the second sub-pixel, the third sub-pixel and the fourth sub-pixel, the first sub-pixel including the first color filter portion, the second sub-pixel including the second color filter portion, the third sub-pixel including the third color filter portion, and the fourth sub-pixel including the fourth color filter portion | S1 |

↓

| Form the second filing layer, the lens layer and the first filing layer sequentially on the substrate on which the first color filter portion, the second color filter portion, the third color filter portion and the fourth color filter portion are formed, the lens layer including at least one dimming lens | S2 |

FIG. 9

DISPLAY PANEL, AND METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2021/086191 filed on Apr. 9, 2021, which claims priority to Chinese Patent Application No. 202010478142.4, filed on May 29, 2020, which are incorporated herein by reference in their entirety.

TECHNICAL FIELD

Embodiments of the present disclosure relate to a display panel and a method for manufacturing the same and a display apparatus.

BACKGROUND

With the continuous development of display technologies, people have higher and higher requirements on image quality (e.g., color gamut) of display apparatuses. For example, a display apparatus may realize full-color display through a color filter layer.

SUMMARY

In an aspect, a display panel is provided. The display panel includes at least one pixel unit. The pixel unit includes a first sub-pixel, a second sub-pixel, a third sub-pixel and a fourth sub-pixel. The first sub-pixel includes a first color filter portion, and the first color filter portion is configured to emit light of a first color. The second sub-pixel includes a second color filter portion, and the second color filter portion is configured to emit light of a second color. The third sub-pixel includes a third color filter portion, and the third color filter portion is configured to emit light of a third color. The light of the third color, the light of the first color light and the light of the second color are light of three primary colors. The fourth sub-pixel includes a fourth color filter portion. A material of fourth color filter portion includes at least one light conversion material. The at least one light conversion material is configured to convert a portion of light directed to the fourth color filter portion into light of at least one primary color. The light of the at least one primary color is capable of being mixed with another portion of the light directed to the fourth color filter portion to generate white light.

In some embodiments, the at least one light conversion material includes at least one of: a green light conversion material, the green light conversion material being configured to convert received light into green light; a yellow light conversion material, the yellow light conversion material being configured to convert received light into yellow light; or, a red light conversion material, the red light conversion material being configured to convert received light into red light.

In some embodiments, the light conversion material of the fourth color filter portion includes a green light conversion material and a red light conversion material, the fourth color filter portion is set in at least one of the following manners: a doping mass percentage of the red light conversion material in the fourth color filter portion is approximately 0.5 times a doping mass percentage of the green conversion material in the fourth color filter portion; the fourth color filter portion includes a first film layer and a second film layer that are stacked sequentially in a direction from a light-incidence side of the fourth color filter portion to a light-exit side of the fourth color filter portion, a material of the first film layer includes the red light conversion material, and a material of the second film layer includes the green light conversion material; or, the fourth color filter portion includes a first film layer and a second film layer that are stacked sequentially in a direction from the light-incidence side of the fourth color filter portion to the light-exit side of the fourth color filter portion, a material of the first film layer includes the red light conversion material, a material of the second film layer includes the green light conversion material, and a thickness of the first film layer is approximately 0.5 times a thickness of the second film layer.

In some embodiments, a doping mass percentage of a light conversion material in the fourth color filter portion is in a range of 15% to 90%, inclusive.

In some embodiments, a material of at least one color filter portion of the first color filter portion, the second color filter portion, the third color filter portion or the fourth color filter includes a scattering material.

In some embodiments, a particle size of the scattering material is in a range of 5 nm to 1000 nm, inclusive; and/or, a doping mass percentage of the scattering material in a color filter portion where the scattering material is located is in a range of 0.01% to 50%, inclusive.

In some embodiments, the color filter portion with the scattering material includes at least two scattering layers sequentially stacked in a first direction. The first direction is from a light-incidence side of the color filter portion to a light-exit side of the color filter portion. Of two adjacent scattering layers, a doping mass percentage of a scattering material in the scattering layer proximate to the light-exit side of the color filter portion is greater than a doping mass percentage of a scattering material in the scattering layer proximate to the light-incidence side of the color filter portion; and/or, a thickness of each scattering layer is in a range of 0.1 µm to 20 µm, inclusive.

In some embodiments, a color filter portion with the scattering material includes a first scattering layer and a second scattering layer that are sequentially stacked in a first direction, a thickness of the first scattering layer is approximately 4 µm, a doping mass percentage of the scattering material in the first scattering layer is approximately 5%, a thickness of the second scattering layer is approximately 6 µm, and a doping mass percentage of the scattering material in the second scattering layer is approximately 25%; or, the color filter portion with the scattering material includes the first scattering layer, the second scattering layer and a third scattering layer that are sequentially stacked in the first direction, the thickness of the first scattering layer is approximately 3 µm, the doping mass percentage of the scattering layer in the first scattering layer is approximately 3%, the thickness of the second scattering layer is approximately 3 µm, the doping mass percentage of the scattering layer in the second scattering layer is approximately 12%, a thickness of the third scattering layer is approximately 3 µm, and a doping mass percentage of the scattering material in the third scattering layer is approximately 25%. The first direction is from a light-incidence side of the color filter portion to a light-exit side of the color filter portion.

In some embodiments, the first color filter portion includes a red light conversion material, or includes both a red filter material and the red light conversion material. The red filter material is configured to transmit only red light, and the red light conversion material is configured to convert received light into red light. The second color filter portion includes a green light conversion material, or both a green filter material and the green light conversion material. The green filter material is configured to transmit only green light, and the green light conversion material is configured to convert received light into green light. The third color filter portion includes a blue filter material and/or a blue light conversion material. The blue filter material is configured to transmit only blue light, and the blue light conversion material is configured to convert received light into blue light.

In some embodiments, the first color filter portion includes the red filter material and the red light conversion material, a portion of the first color filter portion having the red filter material is located on a light-exit side of a portion of the first color filter portion having the red light conversion material. The second color filter portion includes the green filter material and the green light conversion material, a portion of the second color filter portion having the green filter material is located on a light-exit side of a portion of the second color filter portion having the green light conversion material. The third color filter portion includes the blue filter material and the blue light conversion material, a portion of the third color filter portion having the blue filter material is located on a light-exit side of a portion of the third color filter portion having the blue light conversion material.

In some embodiments, the display substrate further includes: a plurality of color filter portions including the first color filter portion, the second color filter portion, the third color filter portion and the fourth color filter portion; and a plurality of light-emitting portions, each light-emitting portion corresponding to a color filter portion of the plurality of color filter portions.

In some embodiments, the display panel further includes: a first substrate, the plurality of color filter portions being disposed on the first substrate; and a second substrate. The plurality of light-emitting portions are disposed on the second substrate, each light-emitting portion includes at least one group of light-emitting function layer for emitting red light and at least one group of light-emitting function layer for emitting blue light that are stacked in a thickness direction of the second substrate. The first substrate is opposite to the second substrate. The plurality of color filter portions and the plurality of light-emitting portions are located between the first substrate and the second substrate. Each light-emitting portion is located on a light-incidence side of the color filter portion.

In some embodiments, the display panel further includes: a spacer pattern disposed on the first substrate. A distance between a surface of the spacer pattern proximate to the second substrate and the second substrate is less than a distance between a surface of the color filter portion proximate to the second substrate and the second substrate.

In some embodiments, the display panel further includes: a second substrate, the plurality of color filter portions being disposed on the second substrate. Each light-emitting portion includes at least one group of light-emitting functional layers for emitting red light and at least one group of light-emitting functional layers for emitting blue light that are stacked in a thickness direction of the second substrate. Each light-emitting portion is located between the color filter portion and the second substrate.

In some embodiments, the display panel further includes: a spacer pattern disposed on the second substrate. A surface of the spacer pattern proximate to the second substrate is flush with a surface of the color filter portion proximate to the second substrate.

In some embodiments, the display panel further includes: at least one dimming lens disposed between the light-emitting portions and the color filter portions. Each dimming lens is configured to converge light emitted by a light-emitting portion, so that the light emitted by the light-emitting portion is directed to a color filter portion corresponding thereto.

In some embodiments, a surface of the dimming lens proximate to the light-emitting portion is a convex surface, and a surface of the dimming lens proximate to the color filter portion is a plane or a concave surface.

In some embodiments, the display panel further includes: a first filling layer disposed between the at least one dimming lens and the light-emitting portions, a refractive index of the at least one dimming lens being greater than a refractive index of the first filling layer, a second filling layer disposed between the at least one dimming lens and the color filter portions, and the refractive index of the at least one dimming lens being less than or equal to a refractive index of the second filling layer; and/or the at least one dimming lens includes a plurality of dimming lenses, of the plurality of dimming lenses, one or more dimming lenses are provided between each light-emitting portion and the color filter portion corresponding to the light-emitting portion, or the dimming lens is strip-shaped, and orthographic projections of a plurality of light-emitting portions in a same row or in a same column in a reference plane are located within an orthographic projection of a dimming lens in the reference plane, the reference plane being parallel to a plane where the plurality of light-emitting portions are located.

In another aspect, a display apparatus is provided. The display apparatus includes the display panel as described in any one of the above embodiments.

In still another aspect, a method for manufacturing the display panel according to any one of the above embodiments is provided. The method includes: forming the at least one pixel unit on a substrate. The pixel unit includes the first sub-pixel, the second sub-pixel, the third sub-pixel and the fourth sub-pixel. The first sub-pixel includes the first color filter portion, and the first color filter portion is configured to emit light of the first color. The second sub-pixel includes the second color filter portion, and the second color filter portion is configured to emit light of the second color. The third sub pixel includes a third color filter portion, and the third color filter portion is configured to emit light of the third color. The light of the third color, the light of the first color and the light of the second color are the light of three primary colors. The fourth sub-pixel includes the fourth color filter portion. The fourth color filter portion includes the at least one light conversion material, and the at least one light conversion material is configured to convert the portion of the light directed to the fourth color filter portion into the light of the at least one primary color. The light of the at least one primary color is capable of being mixed with the another portion of the light directed to the fourth color filter portion to generate the white light.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these accompanying drawings. In addition, the accompanying drawings in the following description may be regarded as schematic diagrams, but are not limitations on actual sizes of products, actual processes of methods and actual timings of signals involved in the embodiments of the present disclosure.

FIG. 8 is a structural diagram of a display apparatus, in accordance with some embodiments of the present disclosure;

FIG. 9 is a flowchart of a method for manufacturing a display panel, in accordance with some embodiments of the present disclosure.

DETAILED DESCRIPTION

Figure 1:
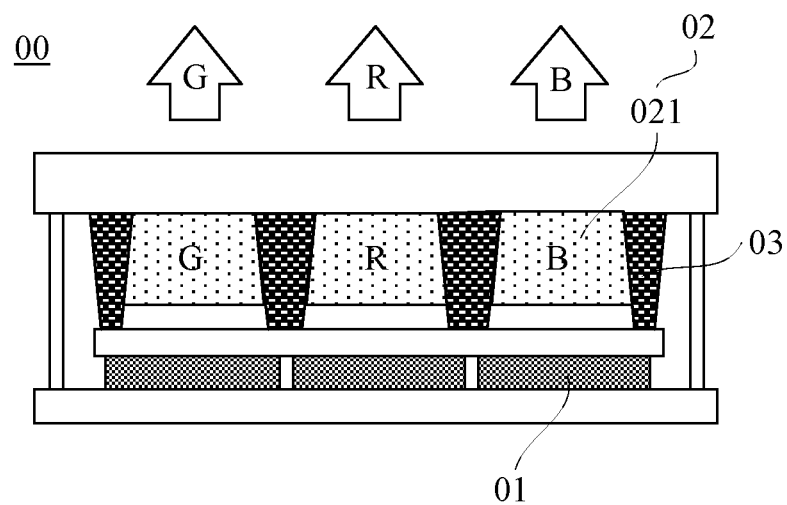
FIG. 1 is a structural diagram of a display apparatus, in the related art.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" and "some examples" are intended to indicate that specific features, structures or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of the embodiments, the expressions "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

As used herein, the term "about" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Therefore, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the region in a device, and are not intended to limit the scope of the exemplary embodiments.

FIG. 1 shows a display apparatus 00 in the related art. As shown in FIG. 1, the display apparatus 00 includes a plurality of light-emitting portions for emitting blue light 01, and a color filter layer 02 and a light shielding pattern 03 that are disposed on a light-exit side of the plurality of light-emitting portions for emitting blue light 01. The color filter layer 02 includes a plurality of filter portions 021 (e.g., green filter portions, red filter portions and blue filter portions). The plurality of filter portions 021 correspond to the plurality of light-emitting portions for emitting blue light 01 in a one-to-one manner (i.e., a single light-emitting portion for emitting blue light 01 and a single filter portion 021 are located in a same sub-pixel). The plurality of filter portions 021 are used to filter blue light entering therein, so as to transmit light of three primary colors used for color display (e.g., the green filter portion may transmit only green light, the red filter portion may transmit only red light, and the blue filter portion may transmit only blue light), thereby realizing full-color display. The light shielding pattern 03 is disposed between any adjacent filter portions 021. The light shielding pattern 03 has a function of absorbing light in the visible wavelength spectrum, and is used to separate the filter portions 021 to prevent cross-color between different filter portions 021 from affecting display effects.

However, in the display apparatus 00, a brightness of the red light emitted by the red filter portion and a brightness of the green light emitted by the green filter portion are both relatively low, and a brightness of the blue light emitted by the blue filter portion is relatively high. That is, the display apparatus 00 has a problem that a light-emitting brightness of red sub-pixels and a light-emitting brightness of green sub-pixels are low, while a light-emitting brightness of blue sub-pixels is high. Such a problem causes a relatively high power consumption of the display apparatus 00 when white images are displayed.

Figure 2:
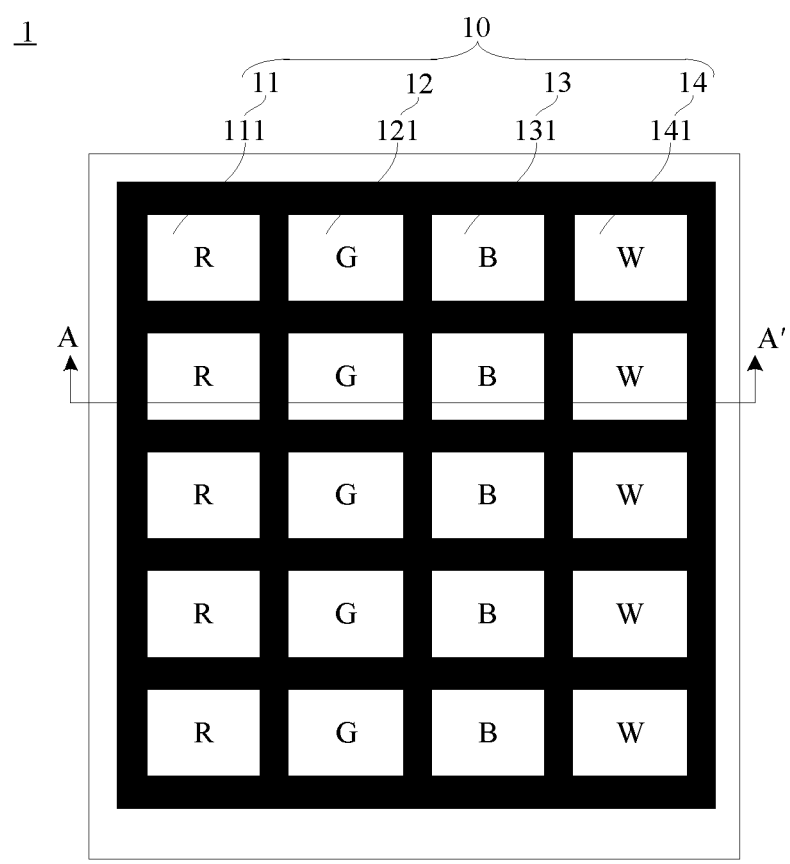
FIG. 2 is a structural diagram of a display panel, in accordance with some embodiments of the present disclosure.

Based on this, some embodiments of the present disclosure provide a display panel. As shown in FIG. 2, the display panel 1 includes at least one pixel unit 10. The pixel unit 10 includes a first sub-pixel 11, a second sub-pixel 12, a third sub-pixel 13 and a fourth sub-pixel 14.

As shown in FIG. 2, the first sub-pixel 11 includes a first color filter portion 111. The first color filter portion 111 is configured to emit light of a first color (e.g., the first color filter portion 111 shown in FIG. 2 is configured to emit red light). The second sub-pixel 12 includes a second color filter portion 121. The second color filter portion 121 is configured to emit light of a second color (e.g., the second color filter portion 121 shown in FIG. 2 is configured to emit green light). The third sub-pixel 13 includes a third color filter portion 131. The third color filter portion 131 is configured to emit light of a third color (e.g., the third color filter portion 111 shown in FIG. 2 is configured to emit blue light). The light of the third color, the light of the first color and the light of the second color light are light of three primary colors. Here, it will be noted that, FIG. 2 is only an example of the present disclosure, but not a limitation to the embodiments of the present disclosure. In the embodiments of the present disclosure, the first color filter portion 111, the second color filter portion 121 and the third color filter portion 131 only need to be capable of emitting the light of the three primary colors. For example, the light of the three primary colors is red light, green light and blue light. For another example, the light of the three primary colors is red light, yellow light and blue light.

As shown in FIGS. 2 and 3A to 3D, the fourth sub-pixel 14 includes a fourth color filter portion 141. A material of the fourth color filter portion 141 includes at least one light conversion material. The at least one light conversion material is configured to convert a portion of light directed to the fourth color filter portion 141 into light of at least one primary color. The light of the at least one primary color is capable of being mixed with the other portion of the light directed to the fourth color filter portion 141 to generate white light.

For example, in a case where the light directed to the fourth color filter portion 141 is blue light and red light, the light conversion material in the fourth color filter portion 141 (e.g., a green light conversion material 101 shown in FIG. 3A) can convert a portion of the blue light into green light, and then the obtained green light is mixed with the red light and the other portion of the blue light directed to the fourth color filter portion 141, so that a purpose of emitting white light is achieved. For another example, in a case where the light directed to the fourth color filter portion 141 is blue light and red light, the light conversion material in the fourth color filter portion 141 (e.g., a yellow light conversion material 102 shown in FIG. 3B) can convert a portion of the blue light into yellow light, and then the obtained yellow light may be mixed with the red light and the other portion of the blue light directed to the fourth color filter portion 141, so that the purpose of emitting white light is achieved. For still another example, in a case where the light directed to the fourth color filter portion 141 is blue light, the light conversion material in the fourth color filter portion 141 (e.g., the green light conversion material 101 and a red light conversion material 103 shown in FIG. 3C) can convert a portion of the blue light into green light and red light, and then the obtained green light and red light are mixed with the other portion of the blue light, so that the purpose of emitting white light is achieved.

It will be noted that, the light conversion material in the fourth color filter portion 141 may be a light conversion material that converts short-wavelength light into long-wavelength light (e.g., converts blue light into green light), or a light conversion material that converts long-wavelength light into short-wavelength light (e.g., converts red light into green light). The embodiment of the present disclosure does not limit this, as long as a requirement that light obtained after conversion is capable of being mixed with unconverted light to generate white light is met.

In the display panel provided in the embodiments of the present disclosure, due to an arrangement of the fourth sub-pixel that can emit white light, the white images may be displayed by just controlling corresponding fourth sub-pixels to emit light, while first sub-pixels (e.g., red sub-pixels), second sub-pixels (e.g., green sub-pixels) and third sub-pixels (e.g., blue sub-pixels) do not need to emit light simultaneously to output white light to display the white images. Therefore, low light-emitting brightness of the red sub-pixels and the green sub-pixels and high light-emitting brightness of the blue sub-pixels will not result in high power consumption when the display panel displays white images. In other words, when displaying the white images, compared with the display apparatus in the related art, the display apparatus having the display panel has an advantage of low power consumption. In addition, it is also beneficial to further improve a service life of the display apparatus.

For example, with reference to FIGS. 3A to 3D, the light conversion material in the fourth color filter portion 141 includes at least one of the green light conversion material 101, the yellow light conversion material 102 and the red light conversion material 103. The green light conversion material 101 is configured to convert received light into green light. The yellow light conversion material 102 is configured to convert the received light into yellow light. The red light conversion material 103 is configured to convert the received light into red light.

Figure 3A:
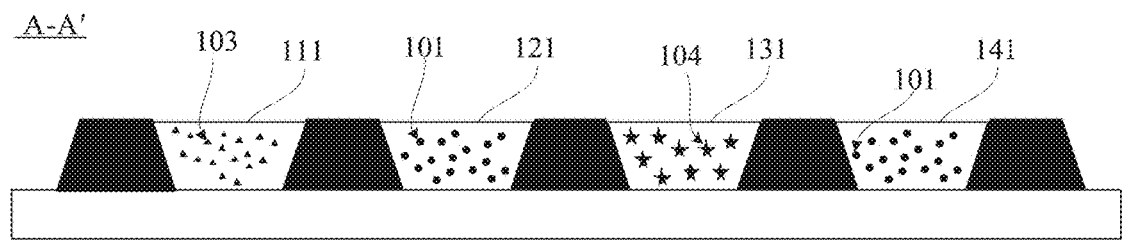
FIG. 3A is a sectional view of a display panel in the direction A-A', in accordance with some embodiments of the present disclosure.
Figure 3B:
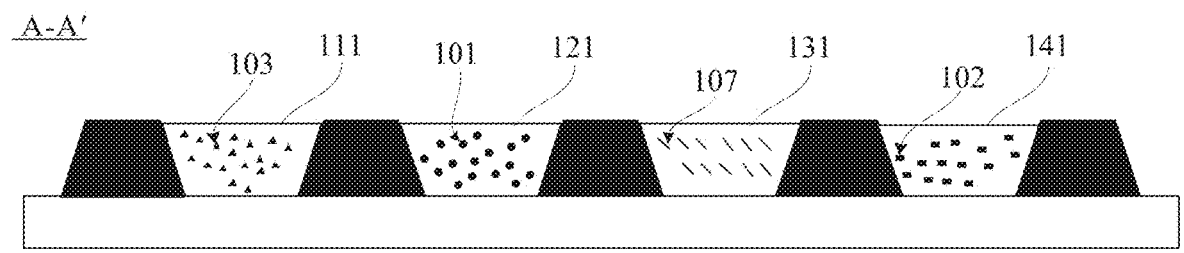
FIG. 3B is a sectional view of another display panel in the direction A-A', in accordance with some embodiments of the present disclosure.
Figure 3C:
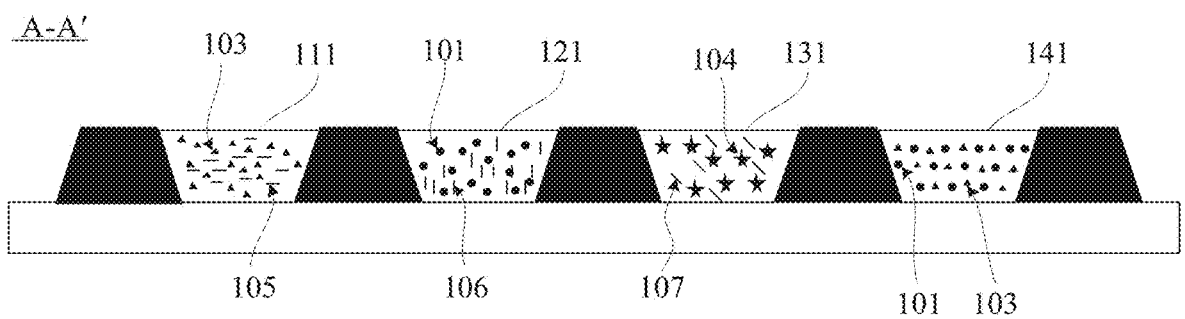
FIG. 3C is a sectional view of still another display panel in the direction A-A', in accordance with some embodiments of the present disclosure.
Figure 3D:
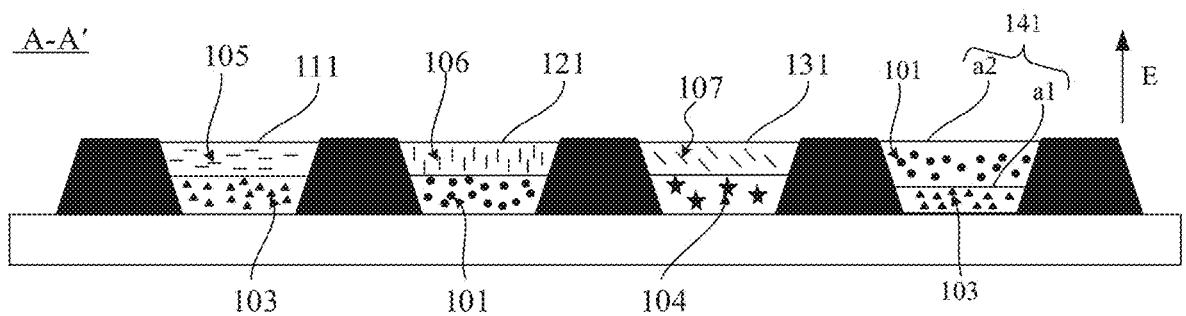
FIG. 3D is a sectional view of still another display panel in the direction A-A', in accordance with some embodiments of the present disclosure.

In a case where the fourth color filter portion 141 includes the green light conversion material 101 and the red light conversion material 103, as shown in FIG. 3C, a doping mass percentage of the red light conversion material 103 in the fourth color filter portion 141 is approximately 0.5 times a doping mass percentage of the green light conversion material 101 in the fourth color filter portion 141 (where "approximately" means that there may be an upward fluctuation or a downward fluctuation on the basis of 0.5 times, for example, it may also be 0.4 times to 0.6 times in practical applications); and/or as shown in FIG. 3D, the fourth color filter portion 141 includes a first film layer a1 and a second film layer a2 that are sequentially stacked in a direction E from a light-incidence side of the fourth color filter portion 141 to a light-exit side of the fourth color filter portion, the first film layer a1 is provided with the red light conversion material 103, and the second film layer a2 is provided with the green light conversion material 101.

In this embodiment, by setting the doping mass percentage of the red light conversion material 103 in the fourth color filter portion 141 to be approximately 0.5 times the doping mass percentage of the green light conversion material 101 in the fourth color filter portion 141, an intensity of the red light obtained after conversion by the fourth color filter portion 141 is less than an intensity of the green light obtained after conversion by the fourth color filter portion 141. Moreover, by providing the first film layer a1 and the second film layer a2, the first film layer a1 being provided with the red light conversion material 103, and the second film layer a2 being provided with the green light conversion material 101, it may be possible to make the red light conversion material play a role in sufficient light conversion. Such a design is beneficial to improve a purity of the white light generated after mixing, and then improve display effects of a white image the display apparatus.

It will be noted that, in a case where the doping mass percentage of the red light conversion material 103 in the fourth color filter portion 141 is approximately 0.5 times the doping mass percentage of the green light conversion material 101 in the fourth color filter portion 141, the two materials may be directly mixed with each other as shown in FIG. 3C, or may be respectively added into the first film layer a1 and the second film layer a2 as shown in FIG. 3D. On the basis of the illustration in FIG. 3D, for example, a thickness of the first film layer a1 may be set to be approximately 0.5 times a thickness of the second film layer a2 (where "approximately" means that there may be an upward fluctuation or a downward fluctuation on the basis of 0.5 times, for example, it may also be 0.4 times to 0.6 times in practical applications). In this case, it may be possible to make the doping mass percentage of the red light conversion material 103 in the first film layer a1 close to the doping mass percentage of the green light conversion material 101 in the second film layer a1, which is further conductive to improving conversion effect of light in the first film layer a1 and the second film layer a2.

In some embodiments, the doping mass percentage of the light conversion material (i.e., all light conversion materials in the fourth color filter portion 141, e.g., includes at least one of the green light conversion material, the yellow light conversion material and the red light conversion material) in the fourth color filter portion 141 is in a range of 15% to 90%, inclusive. For example, the doping mass percentage may be in a range of 50% to 75%, inclusive. For example, the doping mass percentage may be 70%. Such a design prevents the light directed to the fourth color filter portion 141 from being completely absorbed and converted by the light conversion material in the fourth color filter portion 141, so that the light obtained after conversion by the fourth color filter portion 141 may be mixed with unconverted light to output white light.

Any one of the first color filter portion 111, the second color filter portion 121 and the third color filter portion 131 may be provided according to the following examples.

For example, as shown in FIGS. 3A to 3D, the first color filter portion 111 includes the red light conversion material 103; alternatively, the first color filter portion 111 includes both a red filter material 105 and the red light conversion material 103. The red filter material 105 is configured to transmit only red light. The red light conversion material 103 is configured to convert received light into red light. That is, the first color filter portion 111 may include only the red light conversion material 103 as shown in FIGS. 3A and 3B, or may include both the red filter material 105 and the red light conversion material 103 as shown in FIGS. 3C and 3D. Moreover, in a case where the first color filter portion 111 includes both the red filter material 105 and the red light conversion material 103, the two materials may be directly mixed with each other as shown in FIG. 3C, alternatively, a portion of the first color filter portion 111 having the red filter material 105 may be disposed on a light-exit side of a portion of the first color filter portion 111 having the red light conversion material 103. With such a design, in a case where light directed to the first color filter portion 111 is not completely converted by the portion of the first color filter portion 111 having the red light conversion material 103, unconverted light may be filtered by using the portion of the first color filter portion 111 having the red filter material 105. Therefore, the first color filter portion 111 may be prevented from emitting light of undesired colors. That is, the first color filter portion may emit red light with relatively high purity.

For example, as shown in FIGS. 3A to 3D, the second color filter portion 121 includes the green light conversion material 101; alternatively, the second color filter part 121 includes both a green filter material 106 and the green light conversion material 101. The green filter material 106 is configured to transmit only green light. The green light conversion material 101 is configured to convert received light into green light. That is, the second color filter portion 121 may include only the green light conversion material 101 as shown in FIGS. 3A and 3B, or may include both the green filter material 106 and the green light conversion material 101 as shown in FIGS. 3C and 3D. Moreover, in a case where the second color filter portion 121 includes both the green filter material 106 and the green light conversion material 101, the two materials may be directly mixed with each other as shown in FIG. 3C; alternatively, a portion of the second color filter portion 121 having the green filter material 106 may be disposed on a light-exit side of a portion of the second color filter portion 121 having the green light conversion material 101. With such a design, in a case where light directed to the second color filter portion 121 is not completely converted by the portion of the second color filter portion 121 having the green light conversion material 101, unconverted light may be filtered by using the portion of the second color filter portion 121 having the green light conversion material 101. Therefore, the second color filter portion 121 may be prevented from emitting light of undesired colors. That is, the second color filter portion 121 may emit green light with relatively high purity.

For example, as shown in FIGS. 3A to 3D, the third color filter portion 131 includes a blue filter material 107 and/or a blue light conversion material 104. The blue filter material 107 is configured to transmit only blue light. The blue light conversion material 104 is configured to convert received light into blue light. That is, the third color filter portion 131 may include only the blue light conversion material 104 as shown in FIG. 3A, only the blue filter material 107 as shown in FIG. 3B, or both the blue filter material 107 and the blue light conversion material 104 as shown in FIGS. 3C and 3D. Moreover, in a case where the third color filter portion 131 includes both the blue filter material 107 and the blue light conversion material 104, the two materials may be directly mixed with each other as shown in FIG. 3C; alternatively, as shown in FIG. 3D, a portion of the third color filter portion 131 having the blue filter material 107 is disposed on a light-exit side of a portion of the third color filter portion 131 having the blue light conversion material 104. With such a design, in a case where light directed to the third color filter portion 131 is not completely converted by the portion of the third color filter portion 131 having the blue light conversion material 104, unconverted light may be filtered by using the portion of the third color filter portion 131 having the blue light conversion material 107. Therefore, the third color filter portion 131 may be prevented from emitting light of undesired colors. That is, the third color filter portion 131 may emit blue light with relatively high purity.

The red filter material 105, the green filter material 106 and the blue filter material 107 may be photoresist materials. The green light conversion material 101, the yellow light conversion material 102, the red light conversion material 103 and the blue light conversion material 104 may be fluorescent materials or quantum dot materials.

Figure 4A:
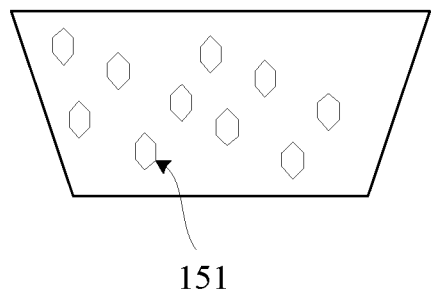
FIG. 4A is a sectional view of a color filter portion, in accordance with some embodiments of the present disclosure.
Figure 4B:
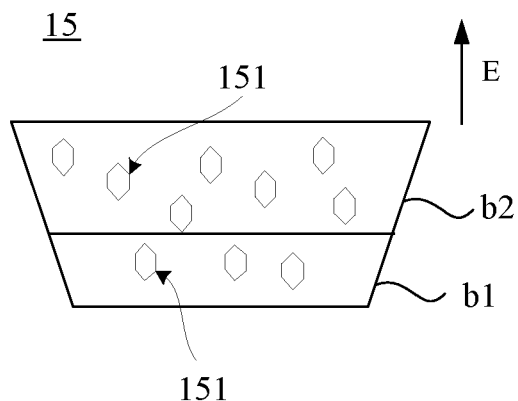
FIG. 4B is a sectional view of another color filter portion, in accordance with some embodiments of the present disclosure.
Figure 4C:
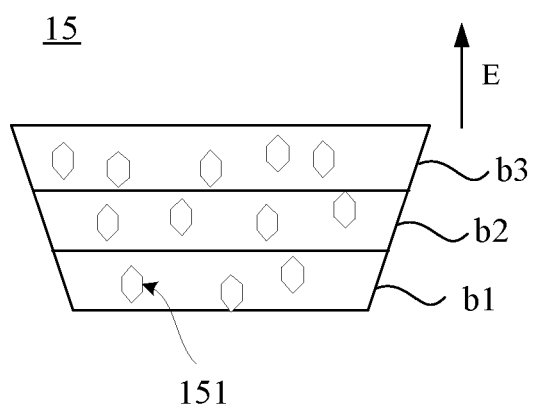
FIG. 4C is a sectional view of still another color filter portion, in accordance with some embodiments of the present disclosure.

In some embodiments, as shown in FIGS. 4A to 4C, at least one of the first color filter portion 111, the second color filter portion 121, the third color filter portion 131 and the fourth color filter portion 141 further includes a scattering material 151. For the convenience of description, a color filter portion 15 is used to represent one of the first color filter portion 111, the second color filter portion 121, the third color filter portion 131 and the fourth color filter portion 141. As shown in FIGS. 4A to 4C, the color filter portion 15 includes the scattering material 151. For example, the scattering material 151 may be a dispersing agent or scattering particles. In a case where the scattering material 151 is the scattering particles, the scattering particles may be used to reflect light back and forth inside the color filter portion 15, so that a light absorption and conversion efficiency of the light conversion material is improved. In a case where the scattering material 151 is the dispersing agent, the dispersing agent itself may be used as particles with a reflective function, and moreover, the dispersing agent may also disperse aggregated substances of solid or liquid particles in the color filter portion 15. In this case, by the dispersing agent itself and the particles obtained after the aggregated substances are dispersed by the dispersing agent, it may be possible to make the light reflect back and forth inside the color filter portion 15. Therefore, the light absorption and conversion efficiency of the light conversion material is greatly improved.

For example, a particle size of the scattering material 151 is in a range of 5 nm to 1000 nm, inclusive. For example, the particle size of the scattering material 151 may be in a range of 50 nm to 200 nm, inclusive. For another example, the particle size of the scattering material 151 may be 5 nm, 50 nm, 100 nm, 200 nm, or 1000 nm. In this way, scattering effect of light inside the color filter portion 15 will be relatively good.

For another example, a doping mass percentage of the scattering material 151 in the color filter portion 15 is in a range of 0.01% to 50%, inclusive. For example, the doping mass percentage may be in a range of 3% to 25%, inclusive. For example, the doping mass percentage may be 3%, 5% or 25%. With such a design, not only may the scattering effect of the light be improved by the scattering material 151, but also a transmittance of the color filter portion 15 will not be affected due to excessive doping of the scattering material 151.

In some examples, as shown in FIGS. 4B and 4C, the color filter portion 15 where the scattering material 151 is located includes at least two scattering layers that are sequentially stacked in a first direction E. The first direction E is from a light-incidence side of the color filter portion 15 to a light-exit side of the color filter portion 15. For example, in FIG. 3D, the first direction E may be from a light-incidence side of the fourth color filter portion 141 to a light-exit side of the fourth color filter portion 141.

Of two adjacent scattering layers, a doping mass percentage of a scattering material in the scattering layer proximate to the light-exit side of the color filter portion 15 (e.g., a second scattering layer b2 in FIG. 4B) is greater than a doping mass percentage of a scattering material in the scattering layer proximate to the light-incidence side of the color filter portion 15 (e.g., a first scattering layer b1 in FIG. 4B). In this way, more light may enter the color filter portion 15, and the light absorption and conversion efficiency of the light conversion material of the color filter portion 15 is improved.

A thickness of each scattering layer (i.e., a dimension in the first direction E) may be in a range of 0.1 μm to 20 μm, inclusive.

For example, as shown in FIG. 4B, the color filter portion 15 where the scattering material 151 is located includes the first scattering layer b1 and the second scattering layer b2 that are sequentially stacked in the first direction E. A thickness of the first scattering layer b1 is approximately 4 μm, and a doping mass percentage of the scattering material 151 in the first scattering layer b1 is approximately 5%. A thickness of the second scattering layer b2 is approximately 6 μm, and a doping mass percentage of the scattering material 151 in the second scattering layer b2 is approximately 25%. The "approximately" means that there may be an upward or downward fluctuation of ten percent on a basis of a corresponding value. For example, the thickness of the first scattering layer b1 being approximately 4 μm may mean that, the thickness of the first scattering layer b1 is in a range of 3.6 μm to 4.4 μm, inclusive. The color filter portion 15 in this example may absorb more light, and a light conversion efficiency of the light conversion material may be improved.

Alternatively, as shown in FIG. 4C, the color filter portion 15 where the scattering material 151 is located includes a first scattering layer b1, a second scattering layer b2 and a third scattering layer b3 that are sequentially stacked in the first direction E. A thickness of the scattering layer b1 is approximately 3 μm, and a doping mass percentage of a scattering material 151 in the first scattering layer b1 is approximately 3%. A thickness of the second scattering layer b2 is approximately 3 μm, and a doping mass percentage of a scattering material 151 in the second scattering layer b2 is approximately 12%. A thickness of the third scattering layer b3 is approximately 3 μm, and a doping mass percentage of a scattering material 151 in the third scattering layer b3 is approximately 25%. The "approximately" means that there may be an upward or downward fluctuation of ten percent on a basis of a corresponding value. For example, the thickness of the first scattering layer b1 being approximately 3 μm may mean that, the thickness of the first scattering layer b1 is in a range of 2.7 μm to 3.3 μm, inclusive. The color filter portion 15 in this example may absorb more light, and the light conversion efficiency of the light conversion material may be improved.

Figure 4D:
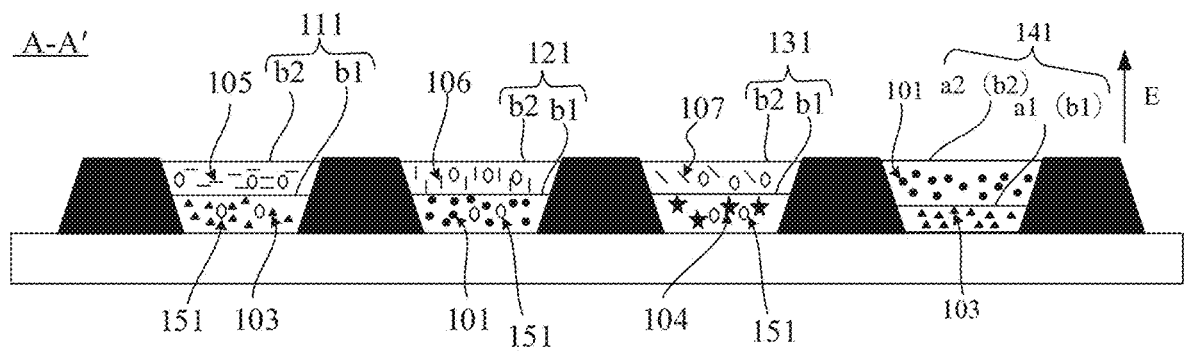
FIG. 4D is a sectional view of still another display panel in the direction A-A', in accordance with some embodiments of the present disclosure.
Figure 4E:
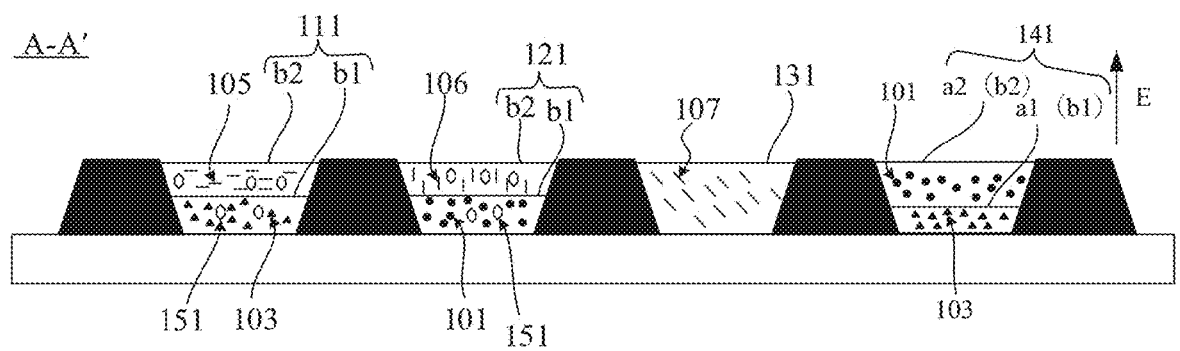
FIG. 4E is a sectional view of still another display panel in the direction A-A', in accordance with some embodiments of the present disclosure.
Figure 4F:
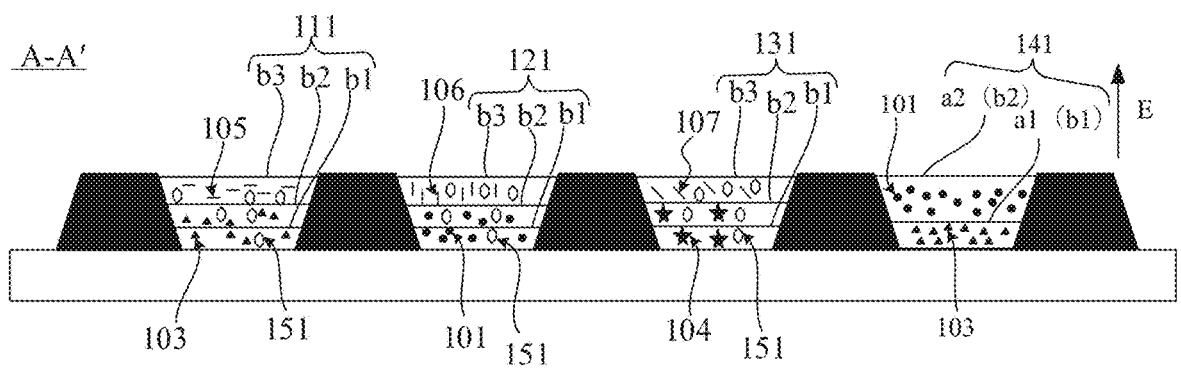
FIG. 4F is a sectional view of still another display panel in the direction A-A', in accordance with some embodiments of the present disclosure.
Figure 4G:
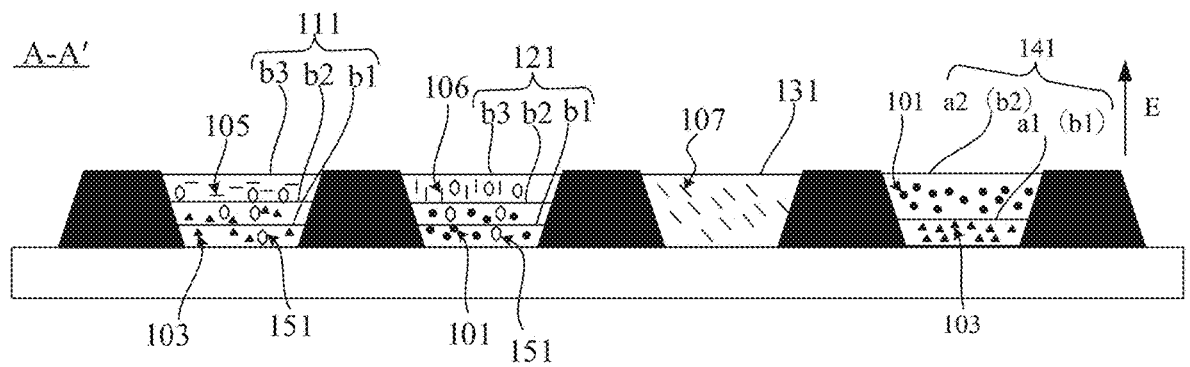
FIG. 4G is a sectional view of still another display panel in the direction A-A', in accordance with some embodiments of the present disclosure.

In a case where the first color filter portion 111 is divided into a first scattering layer b1 and a second scattering layer b2 according to different doping amounts of the scattering material 151, and the first color filter portion 111 includes both the red light conversion material 103 and the red filter material 105, as shown in FIGS. 4D and 4E, the first scattering layer b1 may be set to be doped with the red light conversion material 103, and the second scattering layer b2 may be set to be doped with the red filter material 105. That is, in this case, the portion of the first color filter portion 111 having the red light conversion material 103 is the first scattering layer b1, and the portion of the first color filter portion 111 having the red filter material 105 is the second scattering layer b2. In a case where the first color filter portion 111 is divided into a first scattering layer b1, a second scattering layer b2 and a third scattering layer b3 according to doping mass percentages of the scattering material 151, and the first color filter portion 111 includes both the red light conversion material 103 and the red filter material 105, as shown in FIGS. 4F and 4G, the first scattering layer b1 and the second scattering layer b2 may be set to be doped with the red light conversion material 103, and the third scattering layer b3 may be set to be doped with the red filter material 105. That is, in this case, the portion of the first color filter portion 111 having the red light conversion material 103 is the first scattering layer b1 and the second scattering layer b2, and the portion of the first color filter portion 111 having the red filter material 105 is the third scattering layer b3.

In a case where the second color filter portion 121 is divided into a first scattering layer b1 and a second scattering layer b2 according to different doping amounts of the scattering material 151, and the second color filter portion 121 includes both the green light conversion material 101 and the green filter material 106, as shown in FIGS. 4D and 4E, the first scattering layer b1 may be set to be doped with the green light conversion material 101, and the second scattering layer b2 may be set to be doped with the green filter material 106. That is, in this case, the portion of the second color filter portion 121 having the green light conversion material 101 is the first scattering layer b1, and the portion of the second color filter portion 121 having the green filter material 106 is the second scattering layer b2. In a case where the second color filter portion 121 is divided into a first scattering layer b1, a second scattering layer b2 and a third scattering layer b3 according to doping mass percentages of the scattering material 151, and the second color filter portion 121 includes both the green light conversion material 101 and the green filter material 106, as shown in FIGS. 4F and 4G, the first scattering layer b1 and the second scattering layer b2 may be set to be doped with the green light conversion material 101, and the third scattering layer b3 may be set to be doped with the green filter material 106. That is, in this case, the portion of the second color filter portion 121 having the green light conversion material 101 is the first scattering layer b1 and the second scattering layer b2, and the portion of the second color filter portion 121 having the green filter material 106 is the third scattering layer b3.

In a case where the third color filter portion 131 is divided into a first scattering layer b1 and a second scattering layer b2 according to different doping amounts of the scattering material 151, and the third color filter portion 131 includes both the blue light conversion material 104 and the blue filter material 107, as shown in FIG. 4D, the first scattering layer b1 may be set to be doped with the blue light conversion material 104, and the second scattering layer b2 may be set to be doped with the blue filter material 107. That is, in this case, the portion of the third color filter portion 131 having the blue light conversion material 104 is the first scattering layer b1, and the portion of the third color filter portion 131 having the blue filter material 107 is the second scattering layer b2. In a case where the third color filter portion 131 is divided into a first scattering layer b1, a second scattering layer b2 and a third scattering layer b3 according to doping mass percentages of the scattering material 151, and the third color filter portion 131 includes both the blue conversion layer and the blue filter material 107, as shown in FIG. 4F, the first scattering layer b1 and the second scattering layer b2 may be set to be doped with the blue light conversion material 104, and the third scattering layer b3 may be set to be doped with the blue filter material 107. That is, in this case, the portion of the third color filter portion 131 having the blue light conversion material 104 is the first scattering layer b1 and the second scattering layer b2, and the portion of the third color filter portion 131 having the blue filter material 107 is the third scattering layer b3.

Here, it will be noted that since light directed to the third color filter portion 131 usually includes at least blue light, as shown in FIGS. 4E and 4G, the third color filter portion 131 may include only the blue filter material 107. Moreover, in this case, the third color filter portion 131 may not be provided with the scattering material 151, or may be provided with a plurality of layers of scattering materials.

In a case where the fourth color filter portion 141 is divided into a first scattering layer b1 and a second scattering layer b2 according to doping amounts of the scattering material 151, as shown in FIGS. 4D to 4G, the first scattering layer b1 and the second film layer a2 of the fourth color filter portion 141 may be a same portion of the fourth color filter portion 141, and the second scattering layer b2 and the first film layer a1 of the fourth color filter portion 141 may be another same portion of the fourth color filter portion 141. It will be understood that, embodiments of the present disclosure does not limit this. In some other examples, an interface between the first scattering layer b1 and the second scattering layer b2 of the fourth color filter portion 141 may not coincide with an interface between the first film layer a1 and the second film layer a2 of the fourth color filter portion. In still some other examples, the fourth color filter portion 141 may also be divided into a first scattering layer b1, a second scattering layer b2 and a third scattering layer b3 according to doping amounts of the scattering material 151. The entire fourth color filter portion 141 formed by the three scattering layers may also be divided into the first film layer a1 and the second film layer a2 according to different light conversion materials included therein.

Figure 5A:
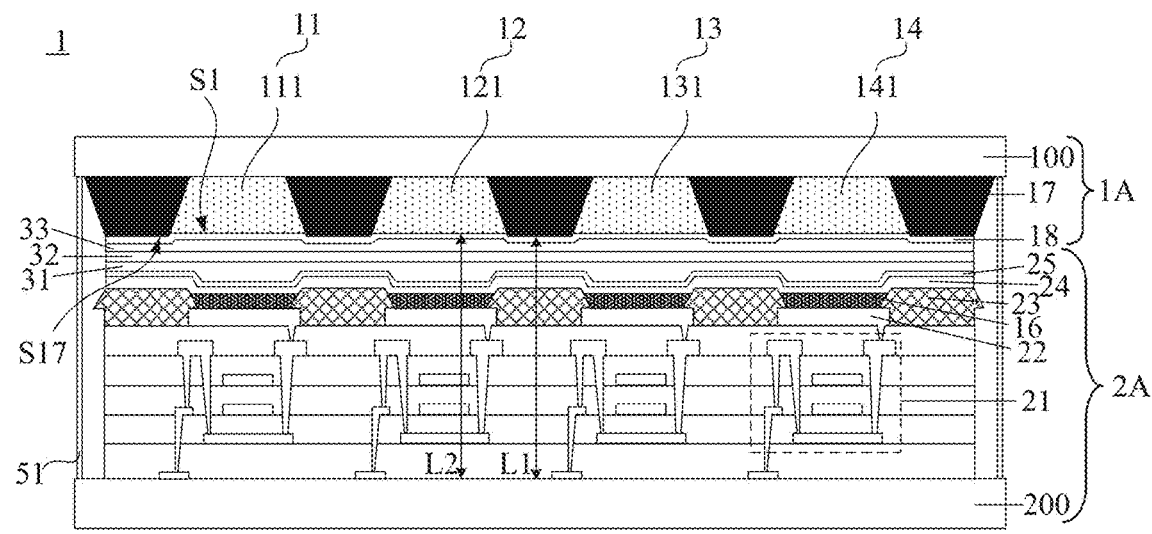
FIG. 5A is a sectional view of a display panel, in accordance with some embodiments of the present disclosure.
Figure 5B:
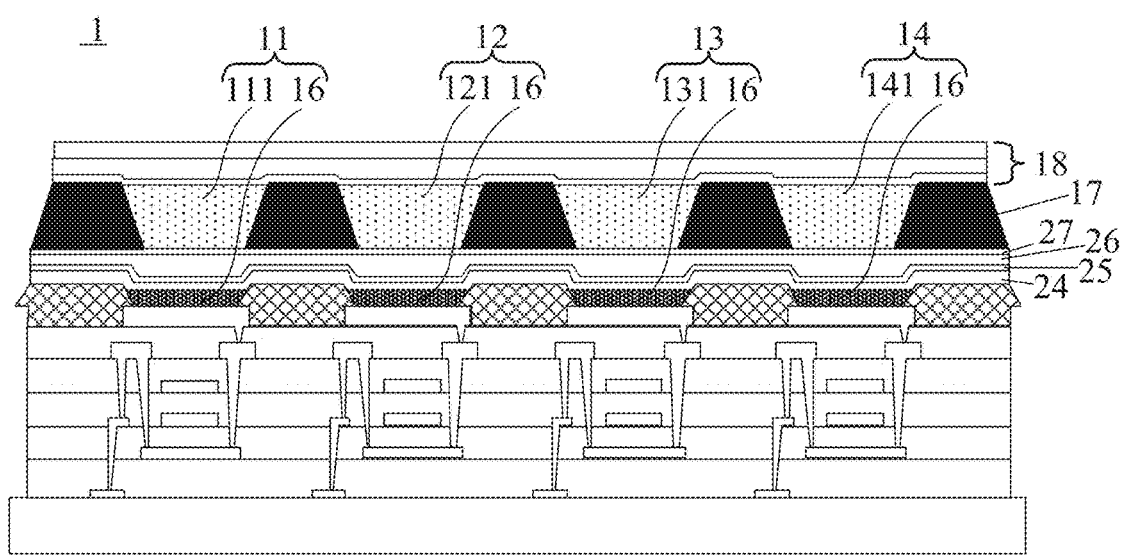
FIG. 5B is a sectional view of another display panel, in accordance with some embodiments of the present disclosure.

It will be noted that, the display panel 1 described in the above embodiments may be a cell-type display panel shown in FIG. 5A (i.e., a display panel formed by assembling a color filter substrate 1A with a display substrate 2A in an opposing setting to form the cell, and connecting the color filter substrate 1A and the display substrate 2A through a frame sealant 51), or a second type of display panel (i.e., a display panel in which a color filter is directly formed on a substrate provided with driving circuits and light-emitting portions) as shown in FIG. 5B. In a case where the display panel 1 is the cell-type display panel, as shown in FIG. 5A, the color filter substrate 1A may be assembled with the display substrate 2A without a color filter in the opposing setting to form the cell, and thus full-color display is realized. In addition to the first color filter portion 111, the second color filter portion 121, the third color filter portion 131 and the fourth color filter portion 141, the color filter substrate 1A further includes a spacer pattern 17 used to separate adjacent color filter portions (e.g., as shown in FIG. 5A, the first color filter portion 111 and the second color filter portion 121, the second color filter portion 121 and the third color filter portion 131, and the third color filter portion 131 and the fourth color filter portion 141). The spacer pattern 17 may prevent cross-color between different color filter portions, thereby improving display effects. Moreover, the spacer pattern 17 may have a function of absorbing and/or reflecting light, and the spacer pattern 17 may be transparent. On this basis, a side surface of the spacer pattern 17 proximate to each color filter portion (e.g., the first color filter portion 111, the second color filter portion 121, the third color filter portion 131 and the fourth color filter portion 141) may be set to have the function of reflecting light (it will be understand that in a case where the spacer pattern is transparent, the function of reflecting light may be realized by coating the side surface with a reflective material). In this way, the light may be better confined inside the color filter portions, thereby facilitating further improving light-emitting brightness of the color filter portions.

On this basis, the color filter substrate 1A of the display panel 1 includes a first substrate 100. The first substrate 100 is used to carry the plurality of color filter portions (e.g., the first color filter portion 111, the second color filter portion 121, the third color filter portion 131 and the fourth color filter portion 141) and the spacer pattern 17. Moreover, a first encapsulation layer 18 may further be formed on the first substrate 100 on which the plurality of color filter portions and spacer patterns 17 are formed. By providing the first encapsulation layer 18, it may be possible to prevent the first color filter portion 111, the second color filter portion 121, the third color filter portion 131 and the fourth color filter portion 141 from being eroded by moisture and oxygen.

With continued reference to FIG. 5A, the display substrate 2A of the display panel 1 includes a second substrate 200, and driving circuits, light-emitting devices and a second encapsulation layer 25 that are sequentially disposed on the second substrate 200. The driving circuit includes a plurality of thin film transistors 21. The light-emitting device includes an anode 22, a light-emitting portion 16 and a cathode 24. The anode 22 is electrically connected to a drain of a thin film transistor 21, serving as a driving transistor, among the plurality of thin film transistors 21. The display substrate 2A without a color filter further includes a pixel defining layer 23. The pixel defining layer 23 includes a plurality of opening regions, and a single light-emitting portion 16 is disposed in a single opening region.

Figure 7A:
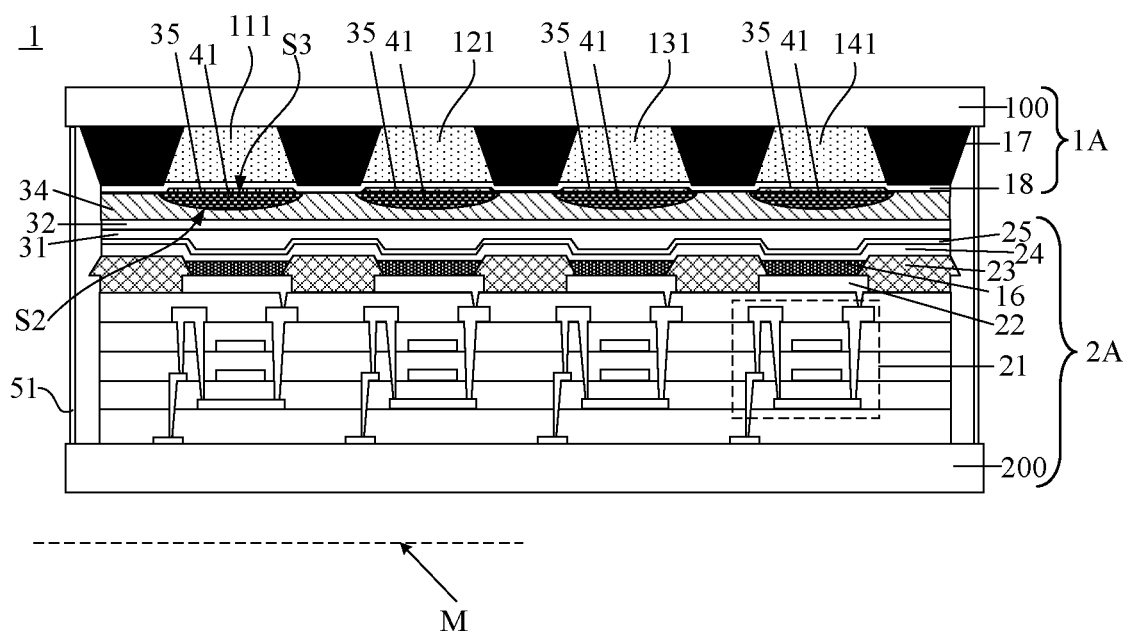
FIG. 7A is a sectional view of still another display panel, in accordance with some embodiments of the present disclosure.

For example, as shown in FIG. 5A, in the display panel 1, when the color filter substrate 1A is assembled with the display substrate 2A in the opposing setting to form the cell, a filling layer may be provided between the color filter substrate 1A and the display substrate 2A. For example, the filling layer may include an organic film layer 31, an inorganic film layer 32 and another organic film layer 33 that are sequentially stacked. In this way, it is beneficial to improve stability and reliability after assembling of the color filter substrate 1A and the display substrate 2A in the opposing setting to form the cell, so that the display panel 1 is not prone to deformation. In addition, a ring of frame sealant 51 (as shown in FIGS. 5A and 7A) may be provided on a side surface of the whole display panel. For example, the frame sealant 51 may be ultraviolet (UV) curing adhesive. In this way, it is beneficial to avoid a penetration of moisture, which increases a service life.

After the color filter substrate 1A is assembled with the display substrate 2A in the opposing setting to form the cell, for example, as shown in FIG. 5A, a distance L1 between a surface S17 of the spacer pattern 17 proximate to the second substrate 200 and the second substrate 200 is less than a distance L2 between a surface S1 of the color filter portions proximate to the second substrate 200 and the second substrate 200. In this way, it may be possible to more effectively avoid cross-color between the plurality of film portions.

After the color filter substrate 1A is assembled with the display substrate 2A in the opposing setting to form the cell, each light-emitting portion 16 is located on a light-incidence side of a color filter portion corresponding thereto. For example, in FIG. 5A, the display panel 2A includes a light-emitting portion 16 located on a light-incidence side of the first color filter portion 121, a light-emitting portion 16 located on a light-incidence side of the second color filter portion 121, a light-emitting portion 16 located on a light-incidence side of the third color filter portion 131, and a light-emitting portion 16 located on a light-incidence side of the fourth color filter portion 141.

In a case where the display panel 1 is the second type of display panel as described above, as shown in FIG. 5B, the second type of display panel includes a second substrate 200. The second substrate 200 are provided with a plurality of color filter portions (e.g., the first color filter portion 111, the second color filter portion 121, the third color filter portion 131 and the fourth color filter portion 141). On this basis, as shown in FIG. 5B, the second type of display panel further includes a plurality of light-emitting portions 16. Each light-emitting portion 16 is located between a single color filter portion and the second substrate 200. For example, in FIG. 5B, the second type of display panel includes a light-emitting portion 16 disposed on a light-incidence side of the first color filter portion 111, a light-emitting portion 16 disposed on a light-incidence side of the second color filter portion 121, and a light-emitting portion 16 disposed on a light-incidence side of the third color filter portion 131, and a light-emitting portion 16 disposed on a light-incidence side of the fourth color filter portion 141.

The second type of display panel, for example, as shown in FIG. 5B, further includes a spacer pattern 17 (the spacer pattern 17 may be the same as the spacer pattern 7 in the color filter substrate 1A, which will not be detailed here) disposed on the second substrate 200. A surface of the spacer pattern 17 proximate to the second substrate 200 is flush with a surface of the color filter portions proximate to the second substrate 200. In this way, it may be possible to more effectively avoid cross-color between the plurality of film portions.

With reference to FIGS. 5A and 5B, a difference between the second type of display panel and the display substrate 2A without a color filter is that, for the second type of display panel, after a second encapsulation layer 25 covering a cathode layer 24 is formed, an organic film layer 26 and an inorganic film layer 27 are formed in sequence. A surface of the inorganic film layer 27 away from the second substrate 200 is a plane, so that it is convenient to form the spacer pattern 17 and the plurality of color filter portions (e.g., the first color filter portion 111, the second color filter portion 121, the third color filter portion 131 and the fourth color filter portion 141) on the inorganic film layer 27 subsequently. Finally, a first encapsulation layer 18 covering the color filter portions and the spacer pattern 17 may be formed. By providing the encapsulation layer 18, the first color filter portion 111, the second color filter portion 121, the third color filter portion 131 and the fourth color filter portion 141 may be protected from being eroded by moisture and oxygen.

For example, both the first encapsulation layer 18 and the second encapsulation layer 25 may be set as a three-layer structure including an inorganic film layer, an organic film layer and another inorganic film layer that are sequentially stacked. In this way, it is beneficial to improve encapsulation effect.

On the basis of either of the above display panels, in some embodiments, the light-emitting portion 16 includes at least one group of light-emitting functional layers for emitting red light 162 and at least one group of light-emitting functional layers for emitting blue light 161 that are stacked in a thickness direction D1 of the second substrate.

Figure 6:
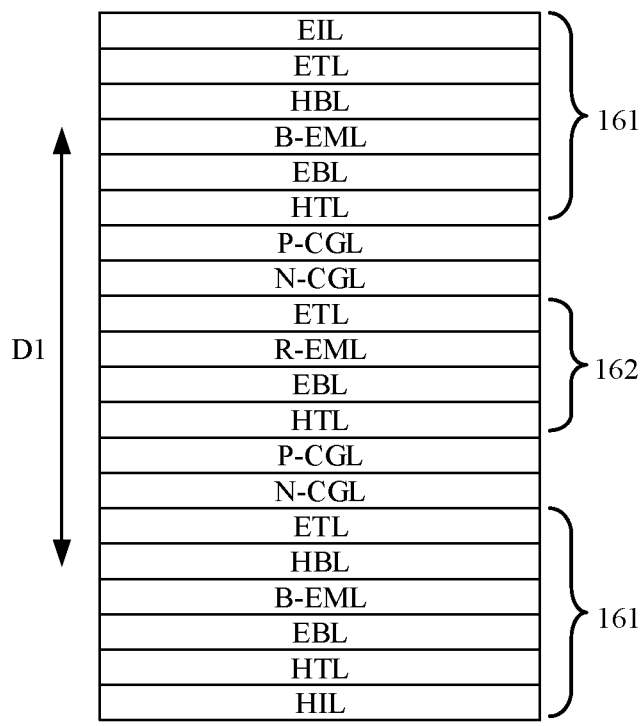
FIG. 6 is a sectional view of a light-emitting portion, in accordance with some embodiments of the present disclosure.

For example, as shown in FIG. 6, the light-emitting portion 16 includes two groups of light-emitting functional layers for emitting blue light 161, and one group of light-emitting functional layers for emitting red light 162 disposed therebetween. On this basis, as shown in FIG. 6, adjacent two groups of light-emitting functional layers may be connected through a P-type charge generation layer P-CGL and an N-type charge generation layer N-CGL. That is, the light-emitting portion 16 may include an electron injection layer EIL, an electron transport layer ETL, a hole blocking layer HBL, a blue light-emitting layer B-EML, an electron blocking layer EBL, a hole transport layer HTL, a P-type charge generation layer P-CGL, an N-type charge generation layer N-CGL, another electron transport layer ETL, a red light-emitting layer R-EML, another electron blocking layer EBL, another hole transport layer HTL, another P-type charge generation layer P-CGL, another N-type charge generation layer N-CGL, another electron transport layer ETL, another hole blocking layer HBL, another blue light-emitting layer B-EML, still another electron blocking layer EBL, still another hole transport layer HTL and a hole injection layer HIL that are sequentially stacked. The P-type charge generation layers P-CGL and the N-type charge generation layers N-CGL can generate electrons and holes due to an external electric field. Therefore, it may be possible to improve light-emitting effects of the light-emitting functional layers located in the middle, and moreover it is beneficial to improve light-emitting stability of the light-emitting portion 16.

The light-emitting portion 16 may emit blue light and red light simultaneously, and an intensity of the blue light is greater. In a case where the light-emitting portion 16 is disposed on the light-incidence side of the fourth color filter portion 141, the light conversion material in the fourth color filter portion 141 (e.g., the green light conversion material 101 shown in FIG. 3A) can convert a portion of blue light into green light, and then the obtained green light after conversion is mixed with red light directed to the fourth color filter portion 141 and the other portion of the blue light, so that the purpose of emitting white light is achieved, and the purity and brightness of the white light are relatively high.

It will be noted that, the light-emitting portion 16 in embodiments of the present disclosure is not limited to the above structure, as long as it is satisfied that the light-emitting portion 16 can cooperate with the fourth color filter portion 141 to emit white light. For example, on the basis of the above structure, it may be possible to reduce or add one group of light-emitting functional layers for emitting blue light 161. In this case, both designs are beneficial to improve the purity and brightness of white light generated by mixing. For another example, the light-emitting portion 16 may be provided with only one or more groups of light-emitting functional layers for emitting blue light 161. In this case, the light-emitting portion 16 is still capable of cooperating with the fourth color filter portion 141 to emit white light (in this case, the fourth color filter portion includes both the green light conversion material and the red light conversion material).

Figure 7B:
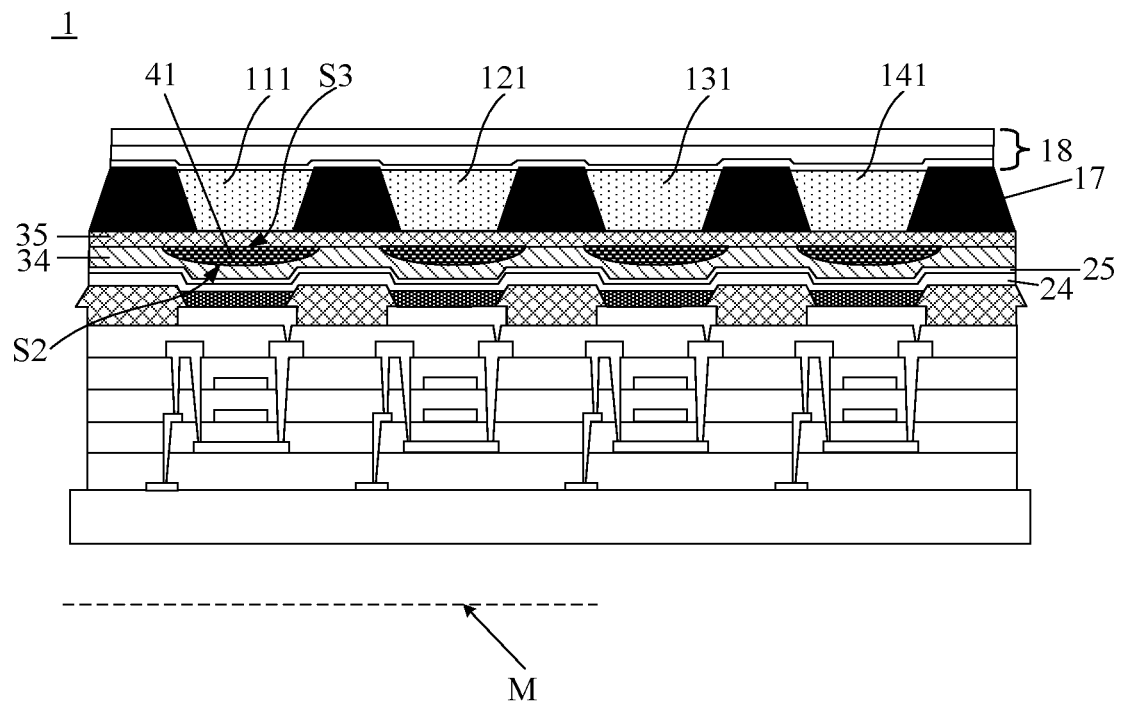
FIG. 7B is a sectional view of still another display panel, in accordance with some embodiments of the present disclosure.
Figure 7C:
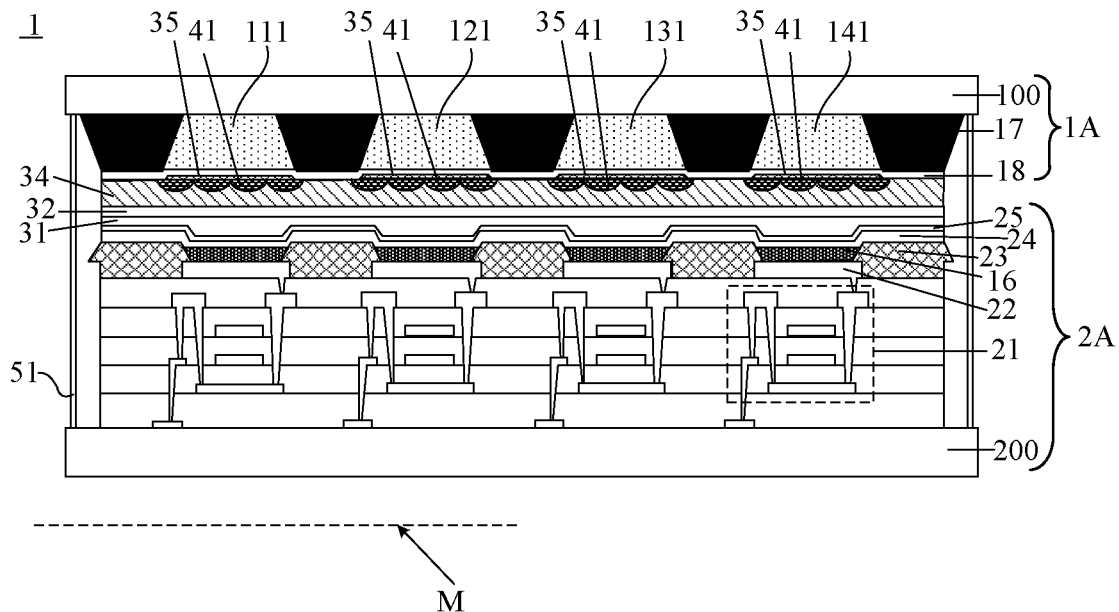
FIG. 7C is a sectional view of still another display panel, in accordance with some embodiments of the present disclosure.
Figure 7D:
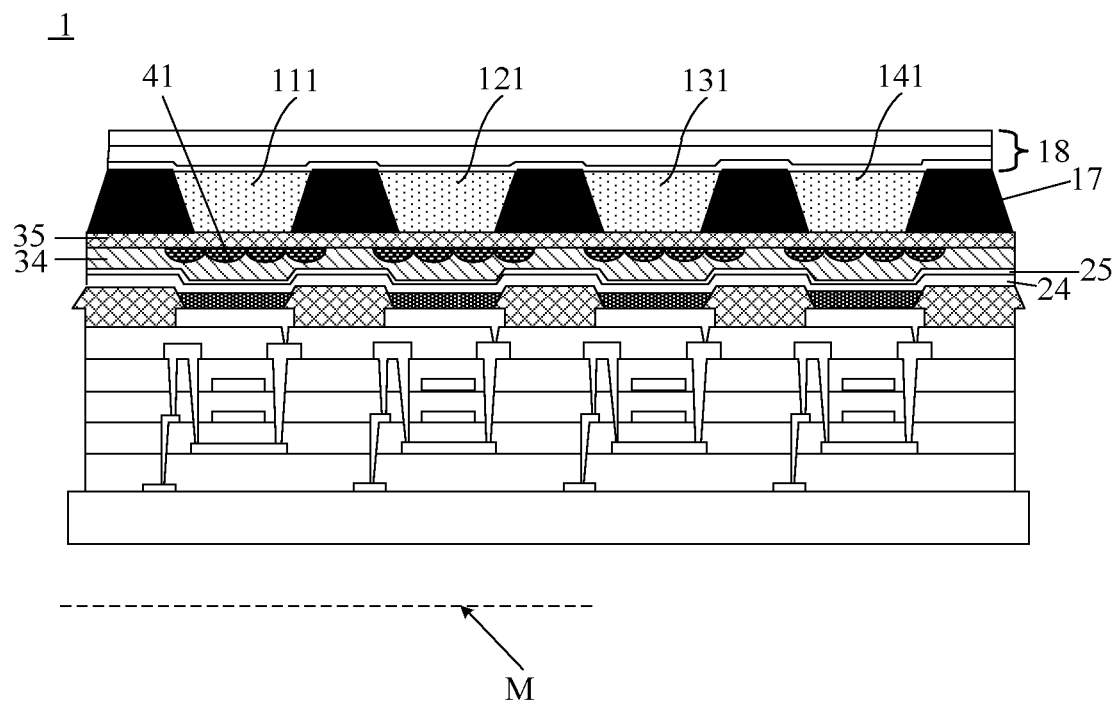
FIG. 7D is a sectional view of still another display panel, in accordance with some embodiments of the present disclosure.

In some embodiments, as shown in FIGS. 7A and 7B, the display panel 1 further includes dimming lenses 41. The dimming lenses 41 are disposed between the light-emitting portions 16 and the color filter portions corresponding to the light-emitting portions 16. For example, one or more dimming lenses 41 are provided between each light-emitting portion 16 and a color filter portion corresponding to the light-emitting portion. In this case, by using the one or more dimming lenses 41 between the light-emitting portion 16 and the color filter portion corresponding to the light-emitting portion 16, light emitted by the light-emitting portion 16 may be converged, so that the light emitted by the light-emitting portion 16 is capable of being directed to the corresponding color filter portion. In a case where there is one dimming lens 41 located between a light-emitting portion 16 and a color filter portion corresponding to the light-emitting portion (e.g., in FIGS. 7A and 7B, a dimming lens 41 is provided on a light-exit side of each of the first color filter portion 111, the second color filter portion 121, the third color filter portion 131 and the fourth color filter portion 141), an orthographic projection of the light-emitting portion 16 in a reference plane M (i.e., a plane parallel to the second substrate 200 or a plane where the plurality of color filter portions are located) and an orthographic projection of the corresponding color filter portion in the reference plane M are both located within an orthographic projection of the dimming lens 41 in the reference plane M. In this way, it may be possible to more effectively converge the light emitted by the light-emitting portion 16, so that the light emitted by the light-emitting portion 16 is capable of being directed to the corresponding color filter portion. In a case where there is a plurality of dimming lenses 41 located between a light-emitting portion 16 and a color filter portion corresponding to the light-emitting portion, as shown in FIGS. 7C and 7D, the plurality of dimming lenses 41 may be arranged in an array, so as to converge light emitted by the light-emitting portion 16 by using the plurality of dimming lenses 41, thereby directing the light emitted by the light-emitting portion 16 to the corresponding color filter portion. And an orthographic projection of the light-emitting portion 16 in the reference plane M and an orthographic projection of the corresponding color filter portion in the reference plane M are both located within an orthographic projection of the plurality of dimming lenses 41 in the reference plane M.

For another example, the dimming lens 41 is strip-shaped, and orthographic projections of a plurality of light-emitting portions 16 in a same row or in a same column in the reference plane are located within an orthographic projection of a single dimming lens 41 in the reference plane M. The reference plane is parallel to the second substrate 200. In this case, it may be possible to converge light emitted by the plurality of light-emitting portions 16 in the same row or in the same column by using the single dimming lens, so that more of the light emitted by each light-emitting portion 16 may be directed to a corresponding color filter portion, thereby facilitating improving display brightness.

It will be noted that the expression of being located within an orthographic projection includes a case where two orthographic projections overlap with each other. Furthermore, for example, it may be possible to set a border of the orthographic projection of the dimming lens 41 in the reference plane 2 μm to 5 μm beyond a border of the orthographic projection(s) of the light-emitting portion(s) and/or a border of the orthographic projection(s) of the color filter portion(s) that are located within the orthographic projection of the dimming lens 41. In this way, more of the light emitted by the light-emitting portion(s) 16 below the dimming lens is collected and concentrated to the color filter portion(s) above the dimming lens.

For example, as shown in FIGS. 7A and 7B, a surface S2 of the dimming lens 41 proximate to the light-emitting portion 16 is a convex surface, and a surface S3 of the dimming lens 41 proximate to the color filter portion is a plane or a concave surface. In this way, a good light convergence effect may be achieved.

Figure 7E:
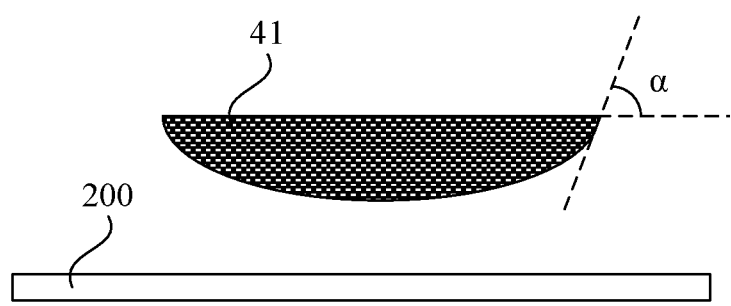
FIG. 7E is a diagram showing a relative positional relationship of a dimming lens and a second substrate, in accordance with some embodiments of the present disclosure.
Figure 7F:
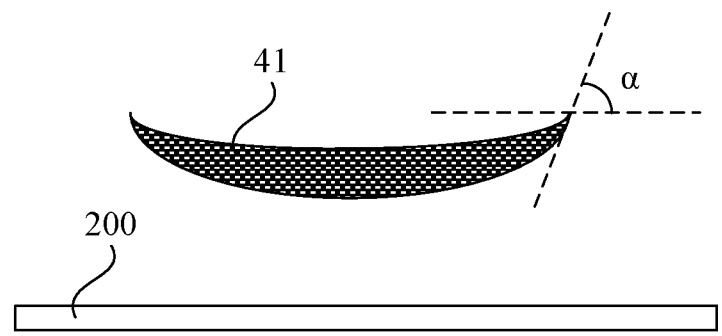
FIG. 7F is a diagram showing a relative positional relationship of another dimming lens and a second substrate, in accordance with some embodiments of the present disclosure.

FIGS. 7E and 7F show schematic sectional views of two types of dimming lenses 41. For example, as shown in FIG. 7E, the dimming lens 41 is a plano-convex lens. In this case, a plane of the dimming lens 41 may be parallel to the second substrate 200, and an included angle α between a tangent line, which passes through any point of a border of a convex surface of the dimming lens 41 and is tangent to the convex surface, and the plane parallel to the second substrate 200 is in a range of 20° to 80°, inclusive. In this way, a good light-gathering effect is achieved. For another example, as shown in FIG. 7F, the dimming lens 41 may be a concave-convex lens. In this case, an included angle α between a tangent line, which passes through any point of a border of a convex surface of the dimming lens 41 and is tangent to the convex surface, and the plane parallel to the second substrate 200 is in a range of 20° to 80°, inclusive. In this way, a good light-gathering effect is achieved.

In some embodiments, as shown in FIGS. 7A to 7D, the display panel 1 further includes a first filling layer 34 and a second filling layer 35. The first filling layer 34 is disposed between the dimming lenses 41 and the light-emitting portions 16. The second filling layer 35 is disposed between the dimming lenses 41 and the color filter portions (e.g., the first to fourth color filter portions). A refractive index of the dimming lens 41 is greater than a refractive index of the first filling layer 34, and less than or equal to a refractive index of the second filling layer 35. With such a design, the light from the light-emitting portions 16 to the corresponding color filter portions will not be totally reflected when passing through the first filling layer 34, the dimming lenses 41 and the second filling layer 35 in sequence, thereby ensuring that more light is directed into the color filter portions.

The first filling layer 34, the dimming lenses 41 and the second filling layer 35 may all be made of resin materials, as long as the refractive indexes of the three satisfies the above requirements. In addition, a thickness of each dimming lens 41 in a direction perpendicular to the reference plane M may be set according to a desired degree of light convergence, which is not limited in embodiments of the present disclosure.

Some embodiments of the present disclosure provide a display apparatus 300. As shown in FIG. 8, the display apparatus 300 includes the display panel described in any one of the above embodiments. The display apparatus 300 may be, for example, any suitable apparatus such as a television, a digital camera, a mobile phone, a watch, a tablet computer, a notebook computer, a navigator. For technical effects of the display apparatus, references may be made to technical effects of the display panel as described in the above embodiments, which will not be repeated here.

Some embodiments of the present disclosure provide a method for manufacturing the display panel. As shown in FIG. 9, the method includes a step S1.

In S1, with reference to FIG. 5A, the at least one pixel unit is formed on a substrate (e.g., the first substrate 100). The pixel unit includes the first sub-pixel 11, the second sub-pixel 12, the third sub-pixel 13 and the fourth sub-pixel 14. The first sub-pixel 11 includes the first color filter portion 111, the second sub-pixel 12 includes the second color filter portion 121, the third sub-pixel 13 includes the third color filter portion 131, and the fourth sub-pixel 14 includes the fourth color filter portion 141. The first substrate 100 may be, for example, a glass substrate, a quartz substrate, a plastic substrate or a substrate of other suitable materials. For example, the first substrate 100 may also be a flexible base substrate. The flexible base substrate is, for example, a transparent substrate and bendable.

The first color filter portion 111 is configured to emit light of the first color. The second color filter portion 121 is configured to emit light of the second color. The third color filter portion 131 is configured to emit light of the third color. The light of the third color, the light of the first color and the light of the second color are light of the three primary colors. The fourth color filter portion 141 includes the at least one light conversion material. The at least one light conversion material is configured to convert the portion of the light directed to the fourth color filter portion 141 into the light of the at least one primary color. The light of the at least one primary color is capable of being mixed with the other portion of the light directed to the fourth color filter portion 141 to generate white light.

For the display panel formed in S1, due to an arrangement of the fourth sub-pixel that can emit white light, white images may be displayed by just controlling corresponding fourth sub-pixels to emit light, while the first sub-pixels (e.g., the red sub-pixels), the second sub-pixels (e.g., the green sub-pixels) and the third sub-pixels (e.g., the blue sub-pixels) do not need to emit light simultaneously to output white light to display the white images. Therefore, it will not result in high power consumption by low light-emitting brightness of the red sub-pixels and the green sub-pixels and high light-emitting brightness of the blue sub-pixels when the display panel displays white images. In other words, when white images are displayed, compared with the display apparatus in the related art, the display apparatus using the display panel has an advantage of lower power consumption. In addition, on this basis, it is also beneficial to further improve the service life of the display apparatus.

On this basis, the method may further include a step S2 in which, with reference to FIG. 7A, the second filing layer 36, a lens layer and the first filing layer 34 are sequentially formed on the substrate (i.e., the first substrate 100) on which the first color filter portion 111, the second color filter portion 121, the third color filter portion 131 and the fourth color filter portion 141 are formed. The lens layer includes at least one dimming lens 41.

Each dimming lens 41 covers at least one color filter portion. A surface of each dimming lens 41 proximate to the at least one color filter portion is a plane or a concave surface, and a surface of each dimming lens 41 away from the at least one color filter portion is a convex surface. In addition, a refractive index of each dimming lens 41 is greater than a refractive index of the first filling layer 34, and less than or equal to a refractive index of the second filling layer 35.

For example, a difference between the refractive index of each dimming lens 41 and the refractive index of the first filling layer 34 is greater than or equal to 0.2. For example, a material of the first filling layer 34 may be set to be a resin material, and the refractive index thereof is in a range of 1.0 to 2.0, inclusive, such as a range of 1.4 to 1.6, inclusive. Correspondingly, a material of the dimming lens 41 may be set to be a resin material, and the refractive index thereof is in a range of 1.0 to 2.3, inclusive, such as a range of 1.6 to 1.8, inclusive.

With reference to FIG. 7A, when the display panel is manufactured, the first encapsulation layer 18 may be coated with a material for forming the second filling layer 35 first, and then the material is cured by a post baking process to form the second filling layer 35. Then, the lens layer including the at least one dimming lens 41 is formed on the second filling layer 35 and the first encapsulation layer 18. Finally, the first filling layer 34 covering the lens layer is formed.

The display panel formed according to S1 and S2 may converge light emitted by at least one light-emitting portion 16 by using the at least one dimming lens 16, so that more of the light emitted by each light-emitting portion 16 may be directed to a corresponding color filter portion, thereby facilitating improving the display brightness. Moreover, since the refractive index of each dimming lens 41 is greater than the refractive index of the first filling layer 34, and less than or equal to the refractive index of the second filling layer 35, the light from the light-emitting portions 16 to the corresponding color filter portions will not be totally reflected when passing through the first filling layer 34, the dimming lenses 41 and the second filling layer 35 in sequence. Therefore, it may be possible to ensure that more light is directed to the color filter portions.

Figure 10:
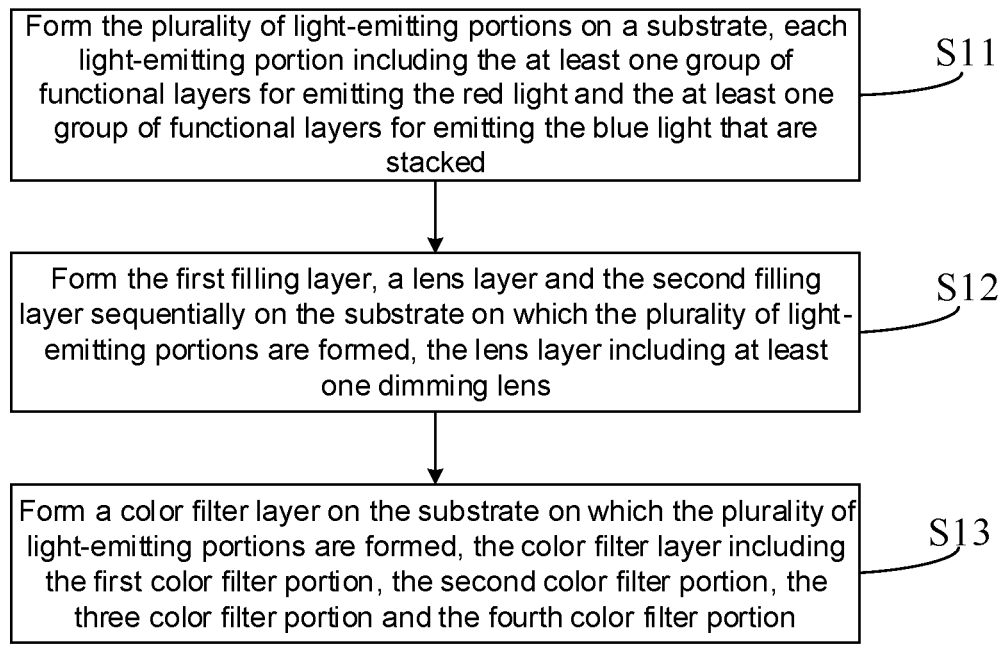
FIG. 10 is a flowchart of a method for manufacturing another display panel, in accordance with some embodiments of the present disclosure.

In the case where the display panel 1 is the second type of display panel as described above, as shown in FIG. 10, the method includes at least steps S11 and S13.

In S11, with reference to FIG. 5B, a plurality of light-emitting portions 16 are formed on a substrate (i.e., the second substrate 200). Each light-emitting portion 16 includes at least one group of functional layers for emitting red light and at least one group of functional layers for emitting blue light that are stacked. The second substrate 200 may be, for example, a glass substrate, a quartz substrate, a plastic substrate or a substrate of other suitable materials. For example, the second substrate 200 may also be a flexible base substrate, and the flexible base substrate is, for example, a transparent substrate and bendable. In addition, the light-emitting portion 16 may be the light-emitting portion 16 described in any one of the above embodiments, which will not be repeated here.

In S13, the color filter layer is formed on the substrate (i.e., the second substrate 200) on which the plurality of light-emitting portions 16 are formed. The color filter layer includes the first color filter portion 111, the second color filter portion 121, the three color filter portion 131 and the fourth color filter portion 141.

For the display panel formed according to S11 and S13, the light conversion material in the fourth sub-pixel 14 can absorb the portion of blue light emitted by the light-emitting portion 16, and convert the portion of the blue light into green light, and the green light is mixed with red light emitted by the light-emitting portion 16 and the other portion of the blue light emitted by the light-emitting portion 16 to generate and output white light. When white images are displayed by the display apparatus using the display panel, compared with display apparatuses in the related art, an advantage of lower power consumption exists. In addition, on this basis, it is also beneficial to further increase the service life of the display apparatus.

On this basis, for example, after S11 and before S13, the method further includes a step S12.

In S12, with reference to FIG. 7B, the first filling layer 34, a lens layer and the second filling layer 35 are sequentially formed on the substrate on which the plurality of light-emitting portions 16 are formed. The lens layer includes at least one dimming lens 41.

Each dimming lens 41 covers at least one light-emitting portion 16. A surface of each dimming lens 41 proximate to the at least one light-emitting portion 16 is a convex surface, and a surface of each dimming lens 41 away from the at least one light-emitting portion 16 is a plane or a concave plane. In addition, a refractive index of each dimming lens 41 is greater than a refractive index of the first filling layer 34, and less than or equal to a refractive index of the second filling layer 35.

With reference to FIG. 7B, when the display panel is manufactured, the second encapsulation layer 25 may be coated with a material for forming the first filling layer 34 (e.g., a resin material with a thickness of approximately 15 μm and a refractive index of approximately 1.4) first, and then the material is patterned. Then a pit corresponding to the dimming lens 41 is formed by a post baking process; and then the pit is coated with a material for forming the dimming lens 41 (e.g., a resin material with a thickness of approximately 10 μm and a refractive index of approximately 1.6), and the material is cured to form the dimming lens 41. Then, a second filling layer 35 is formed on the dimming lens 41. The second filling layer 35 may be an inorganic water blocking layer $SiN_x$. After that, the spacer pattern 17 and the plurality of color filter portions (e.g., the first color filter portion 111, the second color filter portion 121, the third color filter portion 131 and the fourth color filter portion 141) may be formed on the inorganic water blocking layer $SiN_x$. In addition, the second encapsulation layer 25 may be formed on the spacer pattern 17 and the plurality of color filter portions.

The display panel formed according to S11, S12 and S13 may use the at least one dimming lens 41 to converge light emitted by the at least one light-emitting portion 16, so that more of the light emitted by each light-emitting portion 16 may be directed to a corresponding color filter portion, thereby improving the display brightness. Moreover, since the refractive index of each dimming lens 41 is greater than the refractive index of the first filling layer 34, and less than or equal to the refractive index of the second filling layer 35, the light from each light-emitting portion 16 to the corresponding color filter portion will not be totally reflected when passing through the first filling layer 34, the dimming lens 41 and the second filling layer 35 in sequence. Therefore, it may be possible to ensure that more light is directed to the color filter portions.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising at least one pixel unit, the pixel unit including:
    a first sub-pixel, the first sub-pixel including a first color filter portion, the first color filter portion being configured to emit light of a first color;
    a second sub-pixel, the second sub-pixel including a second color filter portion, the second color filter portion being configured to emit light of a second color;
    a third sub-pixel, the third sub-pixel including a third color filter portion, the third color filter portion being configured to emit light of a third color, and the light of the third color, the light of the first color light and the light of the second color being light of three primary colors; and
    a fourth sub-pixel, the fourth sub-pixel including a fourth color filter portion, a material of the fourth color filter portion including at least one light conversion material, the at least one light conversion material being configured to convert a portion of light directed to the fourth color filter portion into light of at least one primary color, and the light of the at least one primary color being capable of being mixed with another portion of the light directed to the fourth color filter portion to generate white light;
    wherein a material of at least one color filter portion of the first color filter portion, the second color filter portion, the third color filter portion or the fourth color filter includes a scattering material; and
    the color filter portion with the scattering material includes at least two scattering layers sequentially stacked in a first direction, the first direction is from a light-incidence side of the color filter portion to a light-exit side of the color filter portion, wherein
        of two adjacent scattering layers, a doping mass percentage of a scattering material in the scattering layer proximate to the light-exit side of the color filter portion is greater than a doping mass percentage of a scattering material in the scattering layer proximate to the light-incidence side of the color filter portion; and/or
        a thickness of each scattering layer is in a range of 0.1 μm to 20 μm, inclusive.

2. The display panel according to claim 1, wherein the at least one light conversion material includes at least one of:
    a green light conversion material, the green light conversion material being configured to convert received light into green light;
    a yellow light conversion material, the yellow light conversion material being configured to convert received light into yellow light; or
    a red light conversion material, the red light conversion material being configured to convert received light into red light.

3. The display panel according to claim 1, wherein the light conversion material of the fourth color filter portion includes a green light conversion material and a red light conversion material, the fourth color filter portion is set in at least one of following manners:
    a doping mass percentage of the red light conversion material in the fourth color filter portion is approximately 0.5 times a doping mass percentage of the green light conversion material in the fourth color filter portion;
    the fourth color filter portion includes a first film layer and a second film layer that are stacked sequentially in a direction from a light-incidence side of the fourth color filter portion to a light-exit side of the fourth color filter portion; and a material of the first film layer includes the red light conversion material, and a material of the second film layer includes the green light conversion material; or
    the fourth color filter portion includes the first film layer and the second film layer that are stacked sequentially in the direction from the light-incidence side of the fourth color filter portion to the light-exit side of the fourth color filter portion; the material of the first film layer includes the red light conversion material, the material of the second film layer includes the green light conversion material, and a thickness of the first film layer is approximately 0.5 times a thickness of the second film layer.

4. The display panel according to claim 1, wherein
    a doping mass percentage of the light conversion material in the fourth color filter portion is in a range of 15% to 90%, inclusive.

5. The display panel according to claim 1, wherein
a particle size of the scattering material is in a range of 5 nm to 1000 nm, inclusive; and/or
a doping mass percentage of the scattering material in the color filter portion where the scattering material is located is in a range of 0.01% to 50%, inclusive.

6. The display panel according to claim 1, wherein the at least two scattering layers include a first scattering layer and a second scattering layer that are sequentially stacked in the first direction; a thickness of the first scattering layer is approximately 4 μm, and a doping mass percentage of the scattering material in the first scattering layer is approximately 5%; a thickness of the second scattering layer is approximately 6 μm, and a doping mass percentage of the scattering material in the second scattering layer is approximately 25%; or
the at least two scattering layers include the first scattering layer, the second scattering layer and a third scattering layer that are sequentially stacked in the first direction; the thickness of the first scattering layer is approximately 3 μm, and the doping mass percentage of the scattering material in the first scattering layer is approximately 3%; the thickness of the second scattering layer is approximately 3 μm, and the doping mass percentage of the scattering material in the second scattering layer is approximately 12%; a thickness of the third scattering layer is approximately 3 μm, and a doping mass percentage of a scattering material in the third scattering layer is approximately 25%.

7. The display panel according to claim 1, wherein
the first color filter portion includes a red light conversion material, or includes both a red filter material and the red light conversion material; the red filter material is configured to transmit only red light, and the red light conversion material is configured to convert received light into red light;
the second color filter portion includes a green light conversion material, or includes both a green filter material and the green light conversion material; the green filter material is configured to transmit only green light, and the green light conversion material is configured to convert received light into green light; and
the third color filter portion includes a blue filter material and/or a blue light conversion material; the blue filter material is configured to transmit only blue light, and the blue light conversion material is configured to convert received light into blue light.

8. The display panel according to claim 7, wherein
the first color filter portion includes the red filter material and the red light conversion material, a portion of the first color filter portion having the red filter material is located on a light-exit side of a portion of the first color filter portion having the red light conversion material;
the second color filter portion includes the green filter material and the green light conversion material, a portion of the second color filter portion having the green filter material is located on a light-exit side of a portion of the second color filter portion having the green light conversion material; and
the third color filter portion includes the blue filter material and the blue light conversion material, a portion of the third color filter portion having the blue filter material is located on a light-exit side of a portion of the third color filter portion having the blue light conversion material.

9. The display panel according to claim 1, further comprising:
a first substrate, the first substrate being disposed with a plurality of color filter portions, the plurality of color filter portions including the first color filter portion, the second color filter portion, the third color filter portion and the fourth color filter portion;
a second substrate; and
a plurality of light-emitting portions disposed on the second substrate, each light-emitting portion including at least one group of light-emitting function layers for emitting red light and at least one group of light-emitting function layers for emitting blue light that are stacked in a thickness direction of the second substrate;
wherein the first substrate is opposite to the second substrate, the plurality of color filter portions and the plurality of light-emitting portions are located between the first substrate and the second substrate, and each light-emitting portion is located on a light-incidence side of a color filter portion of the plurality of color filter portions.

10. The display panel according to claim 9, further comprising:
a spacer pattern disposed on the first substrate, a distance between a surface of the spacer pattern proximate to the second substrate and the second substrate being less than a distance between a surface of the color filter portion proximate to the second substrate and the second substrate.

11. The display panel according to claim 9, further comprising:
at least one dimming lens disposed between the plurality of light-emitting portions and the plurality of color filter portions corresponding to the plurality of light-emitting portions;
wherein each dimming lens is configured to converge light emitted by a light-emitting portion of the plurality of light-emitting portions, so that the light emitted by the light-emitting portion is directed to a color filter portion corresponding to the light-emitting portion.

12. The display panel of claim 11, wherein a surface of the dimming lens proximate to the light-emitting portion is a convex surface, and a surface of the dimming lens proximate to the color filter portion is a plane or a concave surface.

13. The display panel according to claim 11, further comprising:
a first filling layer disposed between the at least one dimming lens and the plurality of light-emitting portions, a refractive index of the at least one dimming lens being greater than a refractive index of the first filling layer; and
a second filling layer disposed between the at least one dimming lens and the plurality of color filter portions, the refractive index of the at least one dimming lens being less than or equal to a refractive index of the second filling layer.

14. The display panel according to claim 11, wherein the at least one dimming lens includes a plurality of dimming lenses, of the plurality of dimming lenses,
one or more dimming lenses are provided between each light-emitting portion and the color filter portion corresponding to the light-emitting portion; or
the dimming lens is strip-shaped, and orthographic projections of a plurality of light-emitting portions in a same row or in a same column in a reference plane are located within an orthographic projection of a dimming lens in the reference plane, the reference plane being parallel to a plane where the plurality of light-emitting portions are located.

15. The display panel according to claim 1, further comprising:
- a second substrate, the second substrate being disposed with a plurality of color filter portions, the plurality of color filter portions including the first color filter portion, the second color filter portion, the third color filter portion and the fourth color filter portion; and
- a plurality of light-emitting portions, each light-emitting portion including at least one group of light-emitting functional layers for emitting red light and at least one group of light-emitting functional layers for emitting blue light that are stacked in a thickness direction of the second substrate;
- wherein each light-emitting portion is located between a color filter portion of the plurality of color filter portions and the second substrate.

16. The display panel according to claim 15, further comprising:
- a spacer pattern disposed on the second substrate, a surface of the spacer pattern proximate to the second substrate being flush with a surface of the color filter portion proximate to the second substrate.

17. The display panel according to claim 15, further comprising:
- at least one dimming lens disposed between the plurality of light-emitting portions and the plurality of color filter portions corresponding to the plurality of light-emitting portions;
- wherein each dimming lens is configured to converge light emitted by a light-emitting portion of the plurality of color filter portions, so that the light emitted by the light-emitting portion is directed to a color filter portion corresponding to the light-emitting portion.

18. A display apparatus, comprising:
- the display panel according to claim 1.

19. A method for manufacturing a display panel, the display panel according to claim 1, comprising:
- forming the at least one pixel unit on a substrate, the pixel unit including the first sub-pixel, the second sub-pixel, the third sub-pixel and the fourth sub-pixel, the first sub-pixel including the first color filter portion, the first color filter portion being configured to emit the light of the first color, the second sub-pixel including the second color filter portion, the second color filter portion being configured to emit the light of the second color, the third sub-pixel including the third color filter portion, the third color filter portion being configured to emit the light of the third color, the light of the third color, the light of the first color and the light of the second color are the light of the three primary colors;
- wherein the fourth sub-pixel includes the fourth color filter portion, the fourth color filter portion includes the at least one light conversion material, the at least one light conversion material is configured to convert the portion of the light directed to the fourth color filter portion into the light of the at least one primary color, the light of the at least one primary color is capable of being mixed with the another portion of the light directed to the fourth color filter portion to generate the white light.

20. A display panel, comprising at least one pixel unit, the pixel unit including:
- a first sub-pixel, the first sub-pixel including a first color filter portion, the first color filter portion being configured to emit light of a first color;
- a second sub-pixel, the second sub-pixel including a second color filter portion, the second color filter portion being configured to emit light of a second color;
- a third sub-pixel, the third sub-pixel including a third color filter portion, the third color filter portion being configured to emit light of a third color, and the light of the third color, the light of the first color light and the light of the second color being light of three primary colors; and
- a fourth sub-pixel, the fourth sub-pixel including a fourth color filter portion, a material of the fourth color filter portion including at least one light conversion material, the at least one light conversion material being configured to convert a portion of light directed to the fourth color filter portion into light of at least one primary color, and the light of the at least one primary color being capable of being mixed with another portion of the light directed to the fourth color filter portion to generate white light;
- wherein a material of at least one color filter portion of the first color filter portion, the second color filter portion, the third color filter portion or the fourth color filter includes a scattering material;
- wherein the color filter portion with the scattering material includes a first scattering layer and a second scattering layer that are sequentially stacked in a first direction; a thickness of the first scattering layer is approximately 4 μm, and a doping mass percentage of the scattering material in the first scattering layer is approximately 5%; a thickness of the second scattering layer is approximately 6 μm, and a doping mass percentage of the scattering material in the second scattering layer is approximately 25%; or
- the color filter portion with the scattering material includes the first scattering layer, the second scattering layer and a third scattering layer that are sequentially stacked in the first direction; the thickness of the first scattering layer is approximately 3 μm, and the doping mass percentage of the scattering material in the first scattering layer is approximately 3%; the thickness of the second scattering layer is approximately 3 μm, and the doping mass percentage of the scattering material in the second scattering layer is approximately 12%; a thickness of the third scattering layer is approximately 3 μm, and a doping mass percentage of a scattering material in the third scattering layer is approximately 25%;
- wherein the first direction is from a light-incidence side of the color filter portion to a light-exit side of the color filter portion.

* * * * *